United States Patent
Yamazaki et al.

(10) Patent No.: US 7,056,810 B2
(45) Date of Patent: Jun. 6, 2006

(54) METHOD FOR MANUFACTURING SEMICONDUCTOR APPARATUS, AND SEMICONDUCTOR APPARATUS AND ELECTRIC APPLIANCE

(75) Inventors: Shunpei Yamazaki, Setagaya (JP); Toru Takayama, Atsugi (JP); Junya Maruyama, Ebina (JP); Yumiko Ohno, Atsugi (JP); Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 28 days.

(21) Appl. No.: 10/728,933

(22) Filed: Dec. 8, 2003

(65) Prior Publication Data
US 2004/0121516 A1 Jun. 24, 2004

(30) Foreign Application Priority Data
Dec. 18, 2002 (JP) .............................. 2002-366158

(51) Int. Cl.
*H01L 21/30* (2006.01)
*H01L 21/46* (2006.01)

(52) U.S. Cl. ..................................................... 438/458
(58) Field of Classification Search ..................... None
See application file for complete search history.

(56) References Cited

U.S. PATENT DOCUMENTS

| | | | |
|---|---|---|---|
| 5,643,801 A | 7/1997 | Ishihara et al. | |
| 5,897,799 A | 4/1999 | Yamazaki et al. | |
| 5,900,980 A | 5/1999 | Yamazaki et al. | |
| 5,923,962 A | 7/1999 | Ohtani et al. | |
| 5,953,597 A | 9/1999 | Kusumoto et al. | |
| 5,959,779 A | 9/1999 | Yamazaki et al. | |
| 6,002,523 A | 12/1999 | Tanaka | |
| 6,038,075 A | 3/2000 | Yamazaki et al. | |
| 6,242,292 B1 * | 6/2001 | Yamazaki et al. | 438/166 |
| 6,339,010 B1 * | 1/2002 | Sameshima | 438/458 |
| 6,372,608 B1 * | 4/2002 | Shimoda et al. | 438/455 |
| 6,544,825 B1 | 4/2003 | Yamazaki | |
| 6,548,370 B1 | 4/2003 | Kasahara et al. | |
| 2004/0069751 A1 | 4/2004 | Yamazaki et al. | |

(Continued)

FOREIGN PATENT DOCUMENTS

JP 04-124813 4/1992

(Continued)

OTHER PUBLICATIONS

N. Hayasaka, "Recent Status of Thin Wafer Chip (die) Mounting," SEMICON Japan 2002, Dec. 5, 2002, pp. 3-8.

*Primary Examiner*—David A. Zarneke
(74) *Attorney, Agent, or Firm*—Eric J. Robinson; Robinson Intellectual Property Law Office, P.C.

(57) ABSTRACT

According to the package and the method for manufacturing the package of the present invention, a chip can be formed extremely to be thin, and manufactured at lower cost and higher throughput, and the variations of a chip thickness can be reduced without back grind that causes cracks or polishing marks. In the present invention, a semiconductor film with a thickness of at most 500 μm deposited over a substrate serving as a support medium is crystallized with a CW laser light, and a chip having a semiconductor device is formed to have a total thickness of 5 μm, preferably at most 2 μm by using the crystallized semiconductor film. Consequently, the chip is mounted on an interposer after separating a substrate.

17 Claims, 15 Drawing Sheets

U.S. PATENT DOCUMENTS

| | | |
|---|---|---|
| 2004/0119955 A1 | 6/2004 | Tanaka |
| 2004/0169023 A1 | 9/2004 | Tanaka |
| 2004/0171237 A1 | 9/2004 | Tanaka et al. |
| 2004/0253838 A1 | 12/2004 | Yamazaki et al. |
| 2004/0259387 A1 | 12/2004 | Yamazaki et al. |
| 2005/0130391 A1* | 6/2005 | Takayama et al. .......... 438/458 |
| 2005/0148121 A1* | 7/2005 | Yamazaki et al. .......... 438/149 |
| 2005/0202595 A1* | 9/2005 | Yonehara et al. ........... 438/110 |

FOREIGN PATENT DOCUMENTS

| | | |
|---|---|---|
| JP | 07-183540 | 7/1995 |
| JP | 07-187890 | 7/1995 |

* cited by examiner

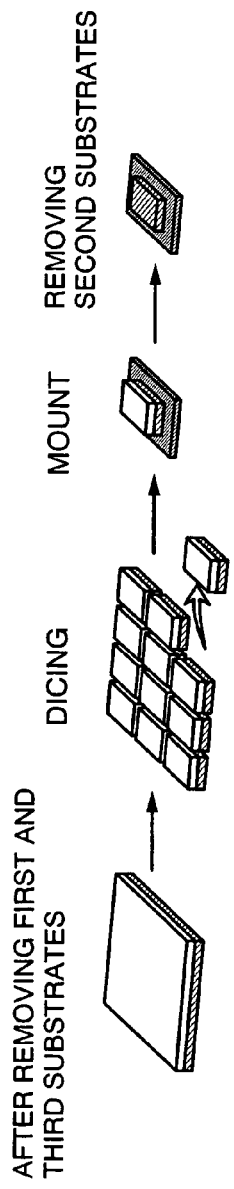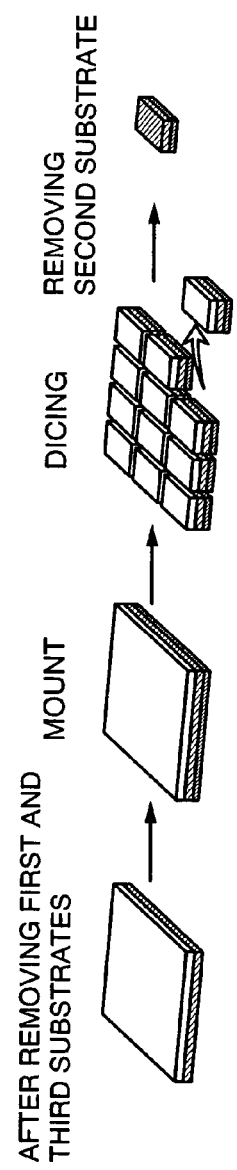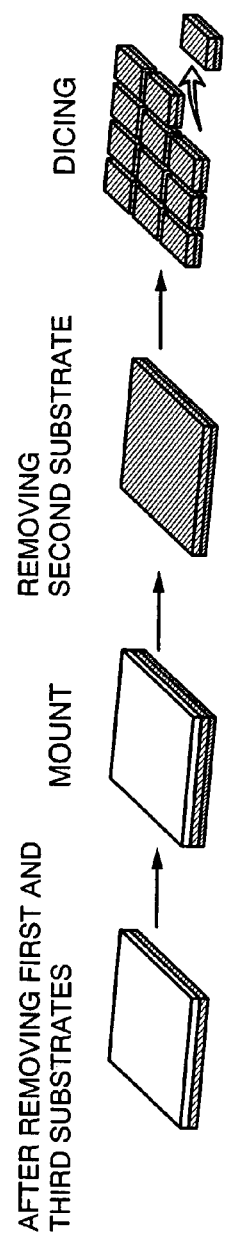

METHOD FOR MANUFACTURING SEMICONDUCTOR APPARATUS, AND SEMICONDUCTOR APPARATUS AND ELECTRIC APPLIANCE

BACKGROUND OF THE INVENTION

1. Field of the Invention

The present invention relates to a semiconductor apparatus (package) and a method for manufacturing the semiconductor apparatus such as CSP (Chip size package) or MCP (Multi chip package) with an integrated circuit (IC) mounted. More specifically, the present invention relates to an electric appliance installed with the package.

2. Related Art

A portable electric appliance as typified by a cellular phone or an electronic book is required various functions such as sending and receiving e-mails, speech recognition, image capturing using a small camera, and the like. On the other hand, downsizing and weight saving of the portable electric appliances needs from users are still increased. Therefore a chip having larger circuit size and larger amount of memory are necessary to be mounted on the limited capacity of the portable electric appliance.

CSP (Chip size package), which is one type of packaging, has attracted attention as a technique for mounting a chip with IC on a printed wiring board. By using CSP, the same level of downsizing and weight saving can be realized at the same level as bare chips. Different from bare chips, CSP is suitable for standardization since an electronic appliance maker is not required special machines and techniques such as a bonder or a clean room for mounting chips provided by a packaging maker. Further, CSP has advantageous functions that bare chips do not have such as a function for protecting chips from outside, a generalizing function for standardizing the footprint of a printed wiring board, and a scale conversion function for enlarging a chip with submicron scale as the millimeter scale of the printed wiring board. CSP becomes an indispensable technique to the electric appliance maker for realizing downsizing and weight saving.

For realizing further downsizing and weight saving of CSP, thinning of the chip mounted on CSP is becoming considered as a problem. For example, the following reference discloses that the target value of the chip thickness is at most 50 μm at present. (Reference 1: SEMICON Japan 2002, Dec. 5, 2002, produced by SEMI Japan, Technical programs for the semiconductor equipment and materials industries, The present state of mounting a thin chip (die), Prospects of reducing the thickness at most 50 μm, Noboru Hayasaka, Fujitsu. Co. Ltd., "Standardized examples and standardizable matters" page 1–8)

Generally, a series of process for manufacturing a chip mounted in a package as typified by CSP is provided with a process for polishing the reverse side of a silicon wafer that is referred to as back grind. By the process for polishing, a chip can be reduced its thickness, size, and weight.

However, the back grind leaves a polishing mark with approximately several ten nm in depth on the reverse side of a silicon wafer. The polishing mark causes reduction of mechanical strength of a chip. There are some cases that a crack is generated in addition to the polishing mark. The crack has a depth of several μm, in some cases, the depth extends to 20 μm. Both of the polishing mark and the crack cause chip destruction during a subsequent process. The problem becomes serious as the thickness of a chip is reduced.

For solving the problems, a process referred to as stress relief may be added after the back grind. The stress relief is carried out for flattening the reverse side of a silicon wafer, specifically, plasma etching, wet etching, dry polishing, or the like is carried out. The stress relief is effective for making the polishing mark disappear with a depth of approximately several ten nm, however it is ineffective for making cracks disappear with a depth from several to 20 μm. In addition, it becomes unfavorable that stress relief is carried out so as to make the cracks disappear since processing time becomes prolonged and the throughput in the process for manufacturing chips becomes decreased.

A device is required to be protected during back grind of the reverse side of silicon wafer by pasting a tape or a substrate over the surface of silicon wafer on which a device is formed. Thus, the total thickness, that is, the thickness of the silicon wafer, the tape, and the substrate, which are pasted for protecting the device, are controlled during the back grind. Surface irregularities approximately from several to several ten μm on the polished silicon wafer will be generated if the tape or the substrate for protecting the device has flexure or uneven thickness. Since the thickness of a silicon wafer has an effect on the characteristics of a chip that is to be manufactured, there will arise a problem of variations of the characteristics due to such uneven thickness.

In addition, the unit cost of a silicon wafer is higher than that of a glass substrate or the like. The sizes of silicon wafers that are comparatively a lot on the market are approximately not more than 12 inches in diameter. Although more than 12 inches sized silicon wafers are also on the market, the unit cost becomes further increased as increasing its size so that such silicon wafers are not suitable to provide low cost chip. However, the silicon wafer with 12 inches in diameter is not suitable for mass-production since the number of chip manufactured from one silicon wafer is limited and throughput of the silicon wafer with only 12 inches is difficult to be improved.

SUMMARY OF THE INVENTION

In view of the foregoing, it is an object of the present invention to provide a package and a method for manufacturing the package by which chips can be reduced its thickness drastically without back grind that causes cracks and polishing marks; chips can be manufactured at lower cost with higher throughput; and the variations of thickness of chips can be prevented. Another object of the present invention is to provide electric appliances installed with the package.

According to the present invention, a semiconductor film having a thickness of at most 500 nm deposited over a substrate serving as a support medium is crystallized with a CW laser light, and a chip having a semiconductor device having a total thickness of at most 5 μm, preferably, 2 μm is manufactured by using the crystallized semiconductor film. Then, the chip is mounted on an interposer after separating the substrate.

Specifically, a metal film is deposited over a first substrate and the surface of the metal film is oxidized to form a metal oxide film having a thin film thickness of several nm. An insulating film and a semiconductor film are sequentially deposited over the metal oxide film. The semiconductor film is crystallized with a CW laser light, and a semiconductor device is manufactured by using the crystallized semiconductor film. Then, a second substrate is pasted to cover the semiconductor device to sandwich the semiconductor device between the first substrate and the second substrate.

A third substrate is pasted on the opposite side of the first substrate on which semiconductor device is formed for reinforcing rigidity of the first substrate. It is better that the first substrate has higher rigidity than that of a second substrate for making it easier for the first substrate to separate and making it harder for a semiconductor device to be damaged. Note that the third substrate is not always necessary to be pasted if the rigidity of the fist substrate is enough for separating itself from a semiconductor device.

Next, a metal oxide film is crystallized by heat-treating to enhance its brittleness and to make it easier for the substrate to separate from the semiconductor device. Then, the first substrate is separated together with the third substrate from the semiconductor device. The metal oxide film can be heat-treated prior to pasting either the third substrate or the second substrate. Or the heat treatment carried out during a process for forming a semiconductor device may be combined with a process for crystallizing the metal oxide film.

The substrate may be separated by splitting-off the interface of the metal film and the metal oxide film, the interface of the insulating film and the metal oxide film, or metal oxide film itself. In any case, the first substrate is separated so as the semiconductor device to cling to the second substrate.

After separating the first substrate, the semiconductor device is mounted over an interposer and the second substrate is separated. In addition, the second substrate is not always necessary to be separated, for example, if mechanical strength is given more emphasis than the thickness of a chip, the chip can be completed with the second substrate being attached.

The way of electrically connecting (bonding) the interposer to the chip can adopt flip chip or wire bonding. In case of using flip chip, the chip is bonded to the interposer simultaneously with mounting the chip on the interposer. In case of using wire bonding, the chip is bonded to the interposer after mounting the chip and separating the second substrate.

In case of forming a plurality of chips over one substrate, the chips are separated each other by dicing. A process for dicing is interposed between any processes after the process for forming a semiconductor device. The chips are preferably diced prior to mounting the chips after separating the first substrate, prior to separating the second substrate after mounting the chips, or after separating the second substrate.

In the present invention, MCP can be formed by mounting a plurality of chips over one interposer. In this case, wire bonding for electrically bonding chips or flip chip may also be used.

The interposer used may connect electrically to a printed wiring board by Leadframe or by using bump. Or the interposer may have another known form.

In the present invention, one chip is formed within the region that is crystallized by using two laser lights and by scanning the region with the two laser lights in one direction. The two lasers are referred to as a first laser light and a second laser light, respectively. Specifically, the first laser light has the wavelength that is equal to or shorter than that of a visible light (at most approximately 780 nm).

A semiconductor film crystallized by using only pulsed laser light is formed of a cluster of a plurality of crystals in which the position and the size of crystal grains are at random. Compared to the interior of the crystal grains, thousands of recombination centers or trapping centers due to an amorphous structure or a crystal defect exist at the interfaces of crystal grains (crystal boundary). There is a problem in that the potential of a crystal grain boundary is increased upon trapping of carriers in the trapping center, and is resulted to a barrier against carriers, and so the current transporting characteristics of carriers are decreased. On the other hand, in case of a CW laser light, a cluster of a crystal grains made of single crystals produced along with the direction of scanning can be formed by means of irradiating a semiconductor film with a laser light while carrying out a scan of the semiconductor film with a beam spot in one direction to grow crystals continuously in the direction of the scanning. However, it is difficult to improve the throughput of the CW laser light by enlarging the area of a beam spot since the output energy per unit time of the CW laser is lower than that of a pulsed laser. Further, in case of crystallizing a silicon film generally used with a thickness of from several ten to several hundreds nm for a semiconductor apparatus by a YAG laser or a $YVO_4$ laser, a second harmonic is preferably used rather than a fundamental wave having shorter wavelength than the second harmonic since the second harmonic has higher absorption coefficient and can crystallize the silicon film efficiently. However, the resistance of a nonlinear optical device to a laser light for converting fundamental waves to higher harmonics is extremely low, for example, a CW YAG laser can output fundamental waves at 10 kW, however, it can output second harmonics approximately at only 10 W. For example, the conversion efficiency of an Nd: YAG laser with respect to converting fundamental waves (wavelength: 1064 nm) to the second harmonics (wavelength: 532 nm) is approximately 50%. Therefore, in order to obtain an energy density required by the crystallization of a semiconductor film, the area of a beam spot should be reduced to approximately $10^{-3}$ $mm^2$, and so a CW laser light is inferior in throughput compared to a pulsed laser light.

In the present invention, a CW second laser light is emitted to the region that is melted by the pulsed first laser light of harmonics. By melting a semiconductor film by emitting the first laser light, the absorption coefficient is increased drastically, and the second laser light becomes easy to be absorbed in the semiconductor film. FIG. 2A shows the value of absorption coefficient ($cm^{-1}$) of an amorphous silicon film vs. the wavelength (nm) of a laser light. FIG. 2B shows the value of absorption coefficient ($cm^{-1}$) of a polysilicon film vs. the wavelength (nm) of a laser light. The absorption coefficient is obtained from extinction coefficient measured from a spectroscopy ellipsometer. From FIGS. 2A, 2B, if the absorption coefficient is at least $5\times10^4$ $cm^{-1}$ (preferably at least $1\times10^4 cm^{-1}$), the semiconductor film can be sufficiently melted by the first laser light. To obtain absorption coefficient in the range, the wavelength of the first laser light is preferably at most 780 nm in case of the amorphous silicon film. The relation of the wavelength of the first laser light and the absorption coefficient differs depending on the materials, crystallinity, or the like, of a semiconductor film. Thus, the wavelength of the first laser light is not limited thereto, and may be controlled so as the absorption coefficient to be appropriately at least $1\times10^4$ $cm^{-1}$. The melted portion by the irradiation of the first laser light shifts while maintaining its molten state within the semiconductor film along with the irradiation of the CW second laser light, and so a cluster of crystal grains grown continuously in the scanning direction can be formed.

The duration of the molten state depends on the balance between output of a pulsed laser light and CW laser light. If next pulsed laser light is emitted to a semiconductor film within the duration of the molten state, it is possible to continue annealing of the semiconductor film while maintaining the molten state. In the extreme case, if the semiconductor film is once melted by a pulsed laser, the semiconductor film may be maintained its molten state with only irradiation of fundamental waves. In this case, only one shot of a pulsed laser light is emitted, subsequently, the molten state may be maintained by emitting a CW laser.

Since energy becomes lower in higher order of harmonics, a second harmonic is most desirable in case of the fundamental waves of the first laser light is approximately 1 µm. However, the present invention is not limited thereto, the first laser light has only to have wavelength equal to or smaller than those of visible light. Emphasis is on output power with respect to the second laser light rather than absorption coefficient to the semiconductor film since the purpose of the second laser light is energizing the first laser light. Thus, fundamental waves are preferably used for the second laser light. However, the present invention is not limited thereto, harmonics may also be used for the second laser light.

In case of using fundamental waves for the second laser light, energy is unnecessary to be reduced in consideration of the deterioration of a nonlinear optical device since wavelength is unnecessary to be converted. For example, the second laser light can achieve 100 times or more (for example, at least 1000 W output power) output power compared to a CW laser having wavelength equal to or smaller than those of visible light. Thus, complicated maintenance of a nonlinear optical device is not required, the total energy of a laser light absorbed in a semiconductor film can be increased, and crystals with bigger grain size diameter can be obtained.

A pulsed laser light has higher energy per unit time than that of a CW laser light. In addition, fundamental waves have higher energy than that of harmonics. In the present invention, the laser light having wavelength equal to or smaller than that of harmonics or visible light is outputted in a pulsed manner, and the laser light of fundamental waves is outputted in a CW manner, and so the design freedom for manufacturing chips can be drastically increased since the area where beam spots of harmonics and fundamental waves are overlapped can be reserved compared to the case that both the harmonics and the fundamental waves are output in a CW manner and that harmonics are output in a CW manner and fundamental waves are output in a pulsed manner.

The device that can produce the first laser light is a pulsed laser selected from an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser.

The device that can produce the second laser light is a CW laser selected from an Ar laser, a Kr laser, a $CO_2$ laser, YAG laser, an $Y_2O_3$ laser, an $YVO_4$ laser, an YLF laser, a $YAlO_3$ laser, an alexandrite laser, a Ti:sapphire laser, or a helium cadmium laser.

For example, an overlapping of two beam spots produced by two lasers is explained taking a CW YAG laser and a pulsed excimer laser as examples.

FIG. 3A shows the state that a beam spot 10 of a fundamental wave laser light produced from a CW YAG laser and a beam spot 11 of a second harmonic laser light produced from a CW YAG laser are overlapped each other. The fundamental wave of a YAG laser can achieve output energy approximately at 10 kW, and the second harmonic of a YAG laser can achieve output energy of approximately at 10 W.

Assuming that 100% of the energy of a laser light is absorbed to a semiconductor film, the crystallinity of the semiconductor film can be improved by setting the energy density of each laser light at from 0.01 to 100 $MW/cm^2$. Thus, the energy density is set at 1 $MW/cm^2$.

Assuming that the shape of the beam spot 10 of a fundamental wave laser light produced from a CW YAG laser is rectangular, let $L_{X1}$ be the length in the direction of a minor axis, and let $L_{Y1}$ be the length in the direction of longitudinal axis, it is appropriate that $L_{X1}$ is set at from 20 to 100 µm, for example, $L_{Y1}$ is appropriate to be set approximately at 50 mm in case that $L_{X1}$ is set at 20 µm; $L_{Y1}$, approximately at 30 mm in case that $L_{X1}$ is set at 30 µm; and $L_{Y1}$, approximately at 10 mm in case that $L_{X1}$ is set at 100 µm in order to meet the energy density. Hence, it is appropriate that $L_{Y1}$ is at least 10 mm, and at most 50 mm to obtain good crystallinity.

Assuming that the shape of the beam spot 11 of a harmonic laser light produced from a CW YAG laser is rectangular, let $L_{X2}$ be the length in the direction of a minor axis, and the let $L_{Y2}$ be the length in the direction of a longitudinal axis, it is appropriate that $L_{X2}$ is set at from 20 to 100 µm, for example, $L_{Y2}$ is appropriate to be set approximately at 100 µm in case that $L_{X2}$ is set at 10 µm in order to meet the energy density.

Assuming that the beam spot 11 is completely overlapped with the beam spot 10, the area of the region where the beam spot 10 of a fundamental wave laser light produced from a CW YAG laser and the beam spot 11 of a second harmonic laser light produced from a CW YAG laser are overlapped each other corresponds to the area of the beam spot 11.

FIG. 3B shows the state that the beam spot 10 of a fundamental wave laser light produced from a CW YAG laser and the beam spot 12 of a pulsed excimer laser light is overlapped each other. The pulsed excimer laser can achieve output energy at approximately 1 J per 1 pulse. In case that a pulse width is approximately 30 ns, output energy is 30 MW per unit time. Thus, assuming that the shape of the beam spot 12 of a pulsed excimer laser light is rectangular, let $L_{X3}$ be the length in the direction of a minor axis, and let $L_{Y3}$ be the length in the direction of a longitudinal axis, it is appropriate that $L_{X3}$ is set at from 20 to 500 µm, for example, $L_{Y3}$ is appropriate to be set approximately at 300 mm in case that $L_{X3}$ is set at 400 µm in order to meet the energy density.

Assuming that the beam spot 10 is completely overlapped with the beam spot 12, the area of the region where the beam spot 10 of a fundamental wave laser light produced from a CW YAG laser and the beam spot 12 of a pulsed excimer laser light are overlapped each other corresponds to the area of the beam spot 10.

Thus, it is better that the first laser light is produced in a CW manner and the second laser light is produced in a pulsed manner rather than that both the first laser light and the second laser light are produced in a CW manner since the region where two laser lights are overlapped with each other can extremely be widen, the design freedom for manufacturing chips can be increased, and throughput can be improved.

The number of the laser light is not limited to two, should just be two or more. A plurality of harmonics of first laser lights or a plurality of second laser lights may be used.

By condensing the beam spot into a linear shape, the width in the longitudinal direction of the beam spot in a region having a cluster of crystallized crystal grains in a scanning direction can be widen as much as possible. Thus, it can be considered that the percentage of an area of a region with less crystalline formed at the both end portions of the longitudinal axis of a beam spot in the total of the beam spot area can be reduced. However, the shape of a beam spot is not limited to a linear shape. There is no problem if annealing can be sufficiently carried out even when the beam spot has a rectangular shape or a planar shape.

A beam spot is processed into an elliptical shape or a rectangular shape each of which is elongated in one direction, and a semiconductor film is scanned in the minor axis direction with the beam spot to be crystallized. According to this, throughput can be improved. The reason why the processed laser light becomes an elliptical shape is that the normal shape of a laser light is round or elongated. If the normal shape of a laser light is an oblong shape, the beam spot may be processed to elongate its longitudinal axis in one direction by a cylindrical lens. A plurality of laser lights may be processed into elliptical shapes or rectangular shapes each having a longitudinal axis in one direction, and these laser lights may be connected each other to be further longer beams in one direction to improve throughput.

As the term used herein "linear shape" refers not to "line" in the strict sense, but "elliptical shape with large aspect ratio (or oblong shape)". For example, although the shape having at least 2 aspect ratios (preferably, from 10 to 10000) is referred to as a linear shape, the fact remains that the linear shape is included in a rectangular shape.

FIG. 1A shows the state that a semiconductor film is crystallized with the first and the second laser lights. Reference numeral 101 denotes a first substrate, and a semiconductor film 102 is formed over the first substrate 101. Reference numeral 103 denotes a beam spot (a first beam spot) formed on the semiconductor film 102 by the first laser light, and 104 denotes a beam spot (a second beam spot) formed on the semiconductor film 102 by the second laser light.

The dotted arrow indicates the relative direction of shift of the beam spots 103, 104 to the semiconductor film 102. The beam spots 103, 104 are emitted to scan the semiconductor film 102 in one direction, and slid in a vertical direction to the scanning direction. Then, these beam spots 103, 104 are emitted again to scan the semiconductor film 102 in the reverse direction to the one direction. By repeating such scanning sequentially, the beam spots 103, 104 can be emitted to the whole surface of the semiconductor film 102. In addition, the distance of sliding the beam spots 103, 104 is preferably the same as the width in the vertical direction to the scanning direction of the beam spot 103.

References numeral 105 to 107 denote regions for using as chips. Each region 105 to 107 is designed to fit within the region that is scanned and crystallized with the beam spots 103, 104 in one direction, anther way of saying, chips are designed so as not to cut across a region with less crystalline formed at both end portions (edge) of the longitudinal axis of the second beam spot 104. According to this, a semiconductor film having hardly crystal grains can be used for a semiconductor device in a chip.

FIG. 1B is an oblique perspective figure showing a package formed by mounting chips 105a to 107a formed in each region 105 to 107 on an interposer 108. These chips can be mounted on the interposer 108 by stacking chips each other as the chips 105a and 106a, or stacking just one chip as the chip 107a. A terminal provided with the interposer 108 may be Ball Grid Array using solder balls, Leadframe by which terminals are arranged circumferentially, or another known conformation.

According to the present invention, the semiconductor film is crystallized with a laser light, and so thermal damage of a glass substrate can be prevented. Consequently, chips can be formed over a low cost glass substrate by using a polycrystalline semiconductor film.

In the present invention, since a larger and lower cost glass substrate than those of a silicon wafer can be used, chips can be mass-produced at a lower cost with higher throughput, so that a manufacturing cost per one chip can be reduced dramatically. In addition, a substrate can be repeatedly used, and so a cost per one chip can be reduced.

It is possible that a chip can be formed to have an extreme thin film thickness such as 5 µm in total, preferably at most 2 µm without back grind that causes cracks or polishing marks. The variations of a chip thickness is approximately at most several hundreds nm since it depends on the variations during a film formation for composing chips. Hence, the variations of the chip thickness can be dramatically reduced compared to the variations of several to several ten µm due to the back grind.

By using a package according to the present invention for an electric appliance, more chips having a large circuit size and a large amount of memory can be installed in the limited capacity of an electric appliance, so that an electric appliance can be formed to have many functions, to be miniaturized, and to be lightweight. Especially, since miniaturization and weight saving are emphasized in a portable electric appliance, it is effective to use the package according to the present invention.

The package according to the present invention can be used for various circuits for controlling a display apparatus such as a liquid crystal display apparatus, a light-emitting apparatus composed of a plurality of pixels each of which is provided with a light-emitting device as typified by an organic light-emitting device, DMD (Digital Micromirror Device), PDP (Plasma Display Panel), FED (Field Emission Display), or the like. In case of an active matrix liquid crystal display apparatus and an active matrix light-emitting apparatus, for example, a scanning line driver circuit for selecting each pixel, a signal line driver circuit for controlling timing to supply video signals to the selected pixels, a controller for producing signals that is supplied to the scanning line driver circuit and the signal line driver circuit, or the like can be formed by using the package according to the present invention. Further, the present invention can be applied not only to a circuit for controlling the drive of a display apparatus, but also to a microprocessor (MPU), a memory, a power circuit, or another digital circuit and an analog circuit. In addition, in the event that characteristics of a semiconductor device as typified by TFTs are improved dramatically, various circuits generally referred to as high frequency circuits can be realized in the package according to the present invention.

The electric appliances according to the present invention includes not only above described display device, but also a video camera, a digital camera, goggle type display (a head mounted display), a navigation system, a sound reproduction apparatus (a car audio, an audio set, or the like), a personal computer, a game machine, a portable information terminal (a mobile computer, a cellular phone, a portable game machine, an electronic book, or the like), an image reproduction apparatus provided with a recording medium (specifically, an apparatus provided with a display that can reproduce a recording medium such as a DVD (Digital Versatile Disc) and display its images). The present invention is useful in case of using for a portable electronic device as typified by a laptop personal computer, a portable video camera, a portable digital camera, a goggle type display (a head mounted display), a portable information terminal (such as a mobile computer, a cellular phone, a portable game machine, or an electronic book).

The package according to the present invention can be applied to not only a CSP, a MCP, but also to packages with various known conformations such as a DIP (Dual In-line Package), a QFP (Quad Flat Package), a SOP (Small Outline Package), or the like.

BRIEF DESCRIPTION OF THE DRAWINGS

FIGS. 9A to 9C are views for showing timing of dicing during a process for manufacturing a package;

DETAILED DESCRIPTION OF THE PREFERRED EMBODIMENTS

Embodiment Mode 1

A method for packaging using a thin semiconductor film crystallized with a first and a second laser light will be explained in Embodiment Mode 1. In this embodiment mode, two TFTs exemplified as a semiconductor device, but not exclusively, a semiconductor device included in chips includes various circuit devices in the present invention. For example, a memory device, a diode, a photoelectric conversion device, a resistive element, a coil, a capacitance element, an inductor, or the like can be typically given, in addition to TFTs.

Figure 5A:
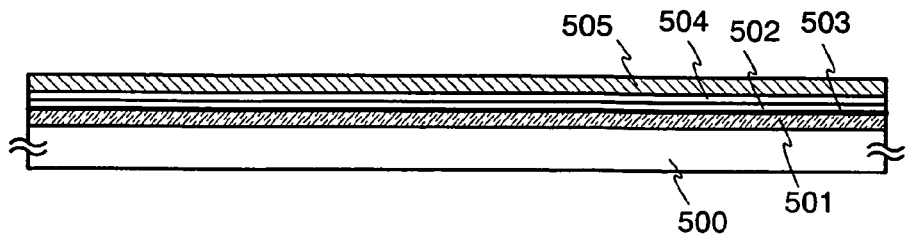
FIGS. 5A to 5E are views for showing a method for manufacturing a package.

As shown in FIG. 5A, a metal film 501 is deposited over a first substrate 500 by sputtering. Here, tungsten is used for forming the metal film 501 and formed to have a thickness of from 10 to 200 nm, preferably, from 50 to 75 nm. In this embodiment mode, the metal film 501 is deposited directly on the first substrate 500, but the metal film 501 may also be deposited after covering the first substrate 500 by an insulating film such as silicon oxide, silicon nitride, silicon oxynitride, or the like.

An oxide film 502 is deposited to be stacked after depositing the metal film 501 without exposing to the air. A silicon oxide film is deposited to have a thickness of from 150 nm to 300 nm as the oxide film 502. In case of depositing by sputtering, a film is deposited over the edge of the first substrate. Hence, the metal film 501 and the oxide film 502 are preferably removed selectively by $O_2$ ashing for preventing the oxide film 502 from remaining over the first substrate 500 in the separating process.

When the oxide film 502 is deposited, pre-sputtering, that is, plasma is generated by shielding between a target and a substrate with shutter, is carried out as a preliminary step toward sputtering. The first substrate 500 is pre-sputtered in parallel under the conditions, that is, Ar flow rate used is 10 sccm; $O_2$, 30 sccm; substrate temperature, 270° C.; and deposition power, 3 kW. A metal oxide film 503 is deposited having an ultra thin thickness of several nm (here, 3 nm) between the metal film 501 and the oxide film 502 by pre-sputtering. The metal oxide film 503 is formed by oxidization of the metal film 501. Hence, the metal oxide film 503 is formed of tungsten oxide.

The metal oxide film 503 is, but not exclusively, deposited by pre-sputtering in this embodiment mode. For example, the metal oxide film 503 may be deposited by oxidizing deliberately the surface of the metal film 501 in plasma using oxygen or oxygen added with inert gases such as Ar or the like.

After depositing the oxide film 502, a base film 504 is deposited by PCVD. Here, a silicon oxynitride film is deposited to have a thickness approximately of 100 nm as the base film 504. After depositing the base film 504, a semiconductor film 505 is deposited without exposing to the atmosphere. The semiconductor film 505 is formed to have a thickness of from 25 to 100 nm, preferably, from 30 to 60 nm. The semiconductor film 505 may be an amorphous semiconductor or a polycrystalline semiconductor. The semiconductor film may be formed of not only silicon but also silicon germanium. In case of using silicon germanium, the concentration of germanium is preferably approximately from 0.01 to 4.5 atomic %.

Figure 5B:
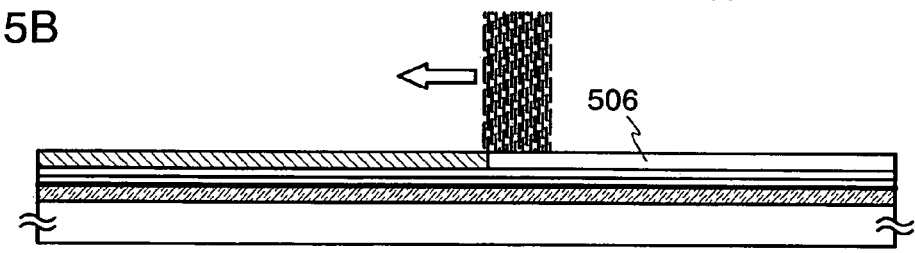

As shown in FIG. 5B, the semiconductor film 505 is crystallized by emitting a first and a second laser light thereto.

YLF laser, that is, output powers of 6 W, one pulse energy of 6 mJ/p, $TEM_{00}$ mode, a second harmonic of 527 nm, oscillation frequency of 1 kHz, and pulse widths of 60 ns is used for producing the first laser light in this embodiment mode. A first beam spot is formed into a rectangular shape having a minor axis of 200 µm and a major axis of 3mm and has energy density of 1000 $mJ/cm^2$ over the surface of the semiconductor film 505 by processing the first laser light by an optical system.

In this embodiment mode, YAG laser achieving output powers of 2 kW and generating fundamental waves of 1.064 µm is used for producing a second laser light. A second beam spot is formed into a rectangular shape having a minor axis of 100 µm and a major axis of 3 mm and has energy density of 0.7 $MW/cm^2$ over the surface of the semiconductor film 505 by processing the second laser light with an optical system.

The first beam spot and the second beam spot are emitted to the surface of the semiconductor film 505 so as to overlap with each other. The two beams made a scan in the direction as indicated by the outline arrow on a colored background in FIG. 5B. Melting the surface by the first laser light makes it easier for the energy of the second laser light to be absorbed in the semiconductor film since the absorption coefficient is enhanced. The region melted by the irradiation of the second laser light, which is a continuous oscillation, shifts within the semiconductor film, so that crystal grains grown continuously in the scanning direction are formed. It becomes possible to form a semiconductor film in which there are hardly existing crystal boundaries at least in the channel direction of a TFT by means of forming particles of single crystal produced along with the scanning direction.

A laser light may be emitted in the inert gas atmosphere such as rare gas or nitride. According to this, the surface roughness of a semiconductor due to a laser irradiation, further, the variations of a threshold value due to the variations of interface state density can be prevented.

The beam spot of a laser light is preferably formed into a linear shape, a rectangular shape, or elliptical shape having more than 5 of a length ratio of a longitudinal axis to a minor axis.

Figure 5C:
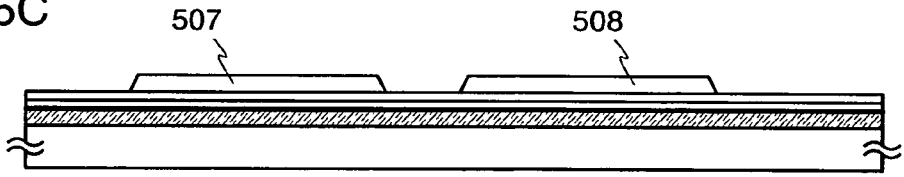

A semiconductor film 506 that is enhanced its degree of crystallinity is formed by irradiating the above described semiconductor film 505 with a laser light. Next, as shown in FIG. 5C, the semiconductor film 506 is patterned to form island like semiconductor films 507, 508. Various semiconductor devices as typified by TFTs are formed using the island like semiconductor films 507, 508. In this embodiment mode, the base film 504 and the island like semiconductor films 507, 508 are in contact with each other, but an electrode, an insulating film, or the like may be formed between the base film 504 and the island like semiconductor films 507, 508 depending on a semiconductor device. For example, in case of a bottom gate TFT that is one of the semiconductor devices, a gate electrode and a gate insulating film are formed between the base film 504 and the island like semiconductor films 507, 508.

Figure 5D:
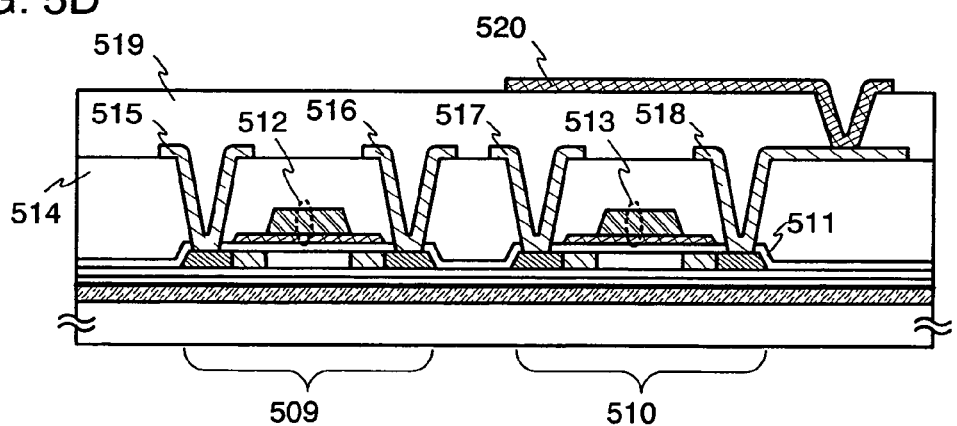

In this embodiment mode, top gate TFTs 509, 510 are formed using the island like semiconductor films 507, 508 (FIG. 5D). Specifically, a gate insulating film 511 is deposited so as to cover the island like semiconductor films 507, 508. Then, a conductive film is deposited over the gate insulating film 511 and patterned, and then, gate electrodes 512, 513 are formed. Next, impurities imparting n-type are added to the gate electrodes 507, 508 using the gate electrodes 512, 513 or resist that is deposited and patterned as masks to form a source region, a drain region, and an LDD (Lightly Doped Drain) region. Here, TFTs 509, 510 are n-type, but impurities imparting p-type are added in case of using p-type TFTs.

According to the above described process, TFTs 509, 510 can be formed. A method for manufacturing the TFTs is not limited to the above described process, which is a subsequent process of forming the island like semiconductors. Mobility, threshold value, and variations of on current between devices can be prevented by using laser crystallization, which is one of the characteristics of the present invention.

A first interlayer insulating film 514 is fabricated so as to cover the TFTs 509, 510. Contact holes are formed in the gate insulating film 511 and the first interlayer insulating film 514, and wirings 515 to 518 connected to the TFTs 509, 510 via the contact holes are formed so as to be in contact with the first interlayer insulating film 514. A second interlayer insulating film 519 is formed over the first interlayer insulating film 514 so as to cover the wirings 515 to 518.

A contact hole is formed in the second interlayer insulating film 519, and a pad 520 is formed over the second interlayer insulating film 519 to connect to the wiring 518 via the contact hole. In this embodiment mode, the pad 520 is electrically connected to the TFT 510 via the wiring 518, but the electrical interconnection between the semiconductor device and the pad 520 is not limited thereto.

A protective layer 521 is formed over the second interlayer insulating film 519 and the pad 520. As a material for forming the protective layer 521, a material which can protect the surface of the second interlayer insulating film 519 and the pad 520 during pasting or separating the second substrate in the subsequent process and which can be removed after separating a second substrate is used. For example, the protective film 521 can be formed by coating resin of epoxy series, acrylate series, or silicon series that is soluble in water over the whole surface and baking.

Figure 5E:
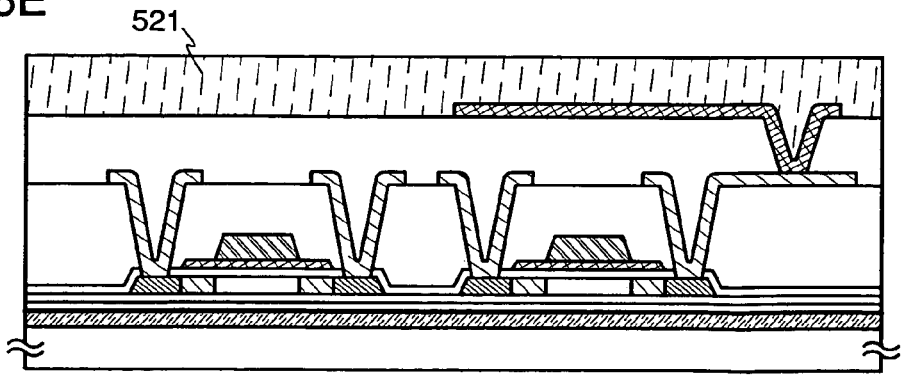

In this embodiment mode, water-soluble resin (TOAGOSEI Co., Ltd.: VL-WSHL10) is spin-coated to have a thickness of 30 μm, and exposed for two minutes to be partially cured, then, exposed its back with UV rays for 2.5 minutes, and then, exposed its surface for 10 minutes to be fully cured. Consequently, the protective layer 521 is formed (FIG. 5E).

In case of stacking a plurality of organic resins, there is a threat of melting the stacked organic resins depending on the solvent during coating or baking, or increasing excessively its density. Therefore in case of forming both the second interlayer insulating film 519 and the protective layer 521 of organic resins that are soluble in the same solvent, an inorganic insulating film (a $SiN_X$ film, a $SiN_XO_Y$ film, an $AlN_X$ film, or an $AlN_XO_Y$ film) is preferably formed so as to cover the second interlayer insulating film 519, and be interposed between the second interlayer insulating film 519 and the pad 520 for removing smoothly the protective film 521 in the subsequent process.

For separating smoothly in the subsequent process, the metal oxide film 503 is crystallized. By this crystallization, the metal oxide film 503 becomes susceptible to fracture and enhanced its brittleness. The crystallization is carried out by heat-treating for approximately from 0.5 to 5 hours at from 420 to 550° C.

Then, some treatments are carried out on the metal oxide film 503 in order to make it easier for the metal oxide film 503 to be separated by weakening partly the adhesiveness between the metal oxide film 503 and the oxide film 502 or the adhesiveness between the metal oxide film 503 and the metal film 501. Specifically, a laser light is emitted to the part of the metal oxide film 503 along with the periphery that is to be separated, or pressuring locally from outside on the metal oxide film 503 along with for damaging a part of the inside or the boundary face of the oxide film 503 along with the periphery that is to be separated. Specifically, a hard needle such as a diamond pen may be attached perpendicular to the periphery of the edge portion of the metal oxide film 503 and moved along with the periphery the metal oxide film 503 with applying loading. Preferably, a scriber device can be used to move with applying loading on the region with press force ranging from 0.1 to 2 mm. It is important to carry out some treatment for easy separating, that is, it is important to prepare for separating process. Such preparatory process for weakening selectively (partly) the adhesiveness will prevent poor separating and improve the process yield.

Figure 6A:
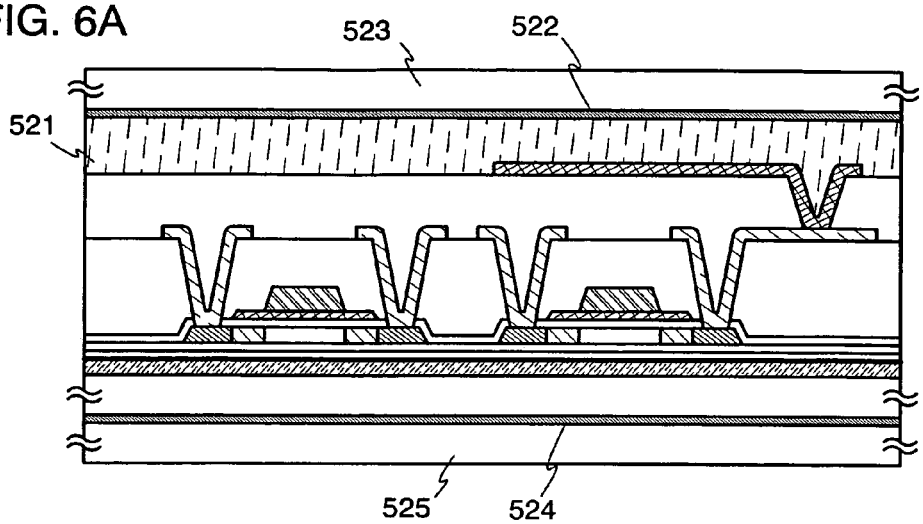
FIGS. 6A to 6C are views for showing a method for manufacturing a package.

Next, a second substrate 523 is pasted over the protective film 521 with a two-sided tape 522, and a third substrate 525 is pasted over the first substrate 500 with a twp-sided tape 524 (FIG. 6A). An adhesive can be used instead of a two-sided tape. For example, it is possible to reduce the load of a semiconductor device, which is increased by separating the second substrate, by using an adhesive that is melted with UV light. The third substrate 525 prevents the destruction of the first substrate 500 in the subsequent process of separating. For the second substrate 523 and the third substrate 525, the substrate that has higher rigidity than that of the first substrate 500, for example, a quartz substrate or a semiconductor substrate is preferably to be used.

Then, the metal film 501 is separated from the oxide film 502 by a physical means. The separation of metal film 501 is started from the region that is partly weakened its adhesiveness to the metal film 501 or the oxide film 502 in the previous process.

Figure 6B:
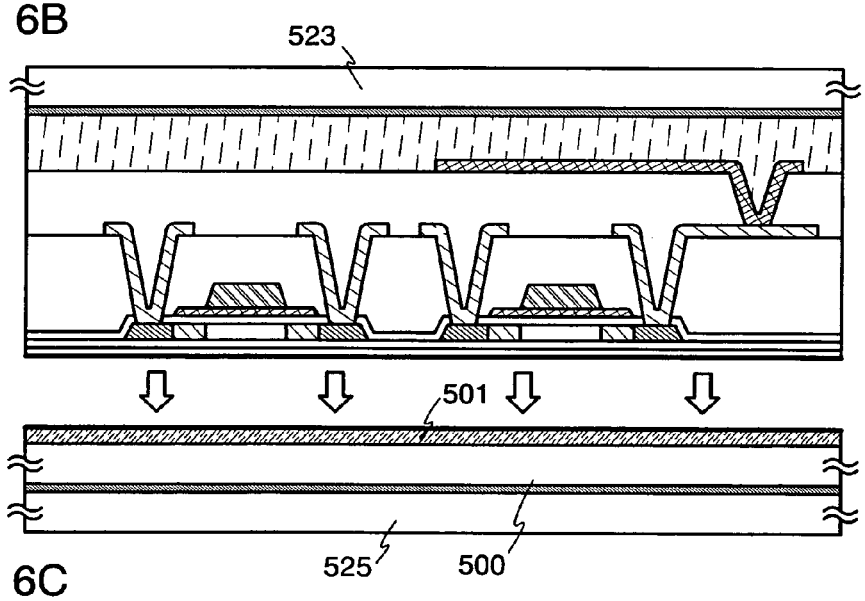

Three separating portions can be resulted from the separation of metal film 501, that is, the separating portion of the metal film 501 and metal oxide film 503, the separating portion of the oxide film 502 and the metal oxide film 503, or the separating portion within the metal oxide film 503. Further, the second substrate 523 on which semiconductor devices (here, TFTs 509, 510) are pasted is separated from the third substrate 525 on which the first substrate 500 and the metal film 501 are pasted. The separation can be carried out with comparatively small force (for example, man's hand, air pressure of gas sprayed from a nozzle, ultrasonic waves, or the like). FIG. 6B shows a state of after the separating process.

Figure 6C:
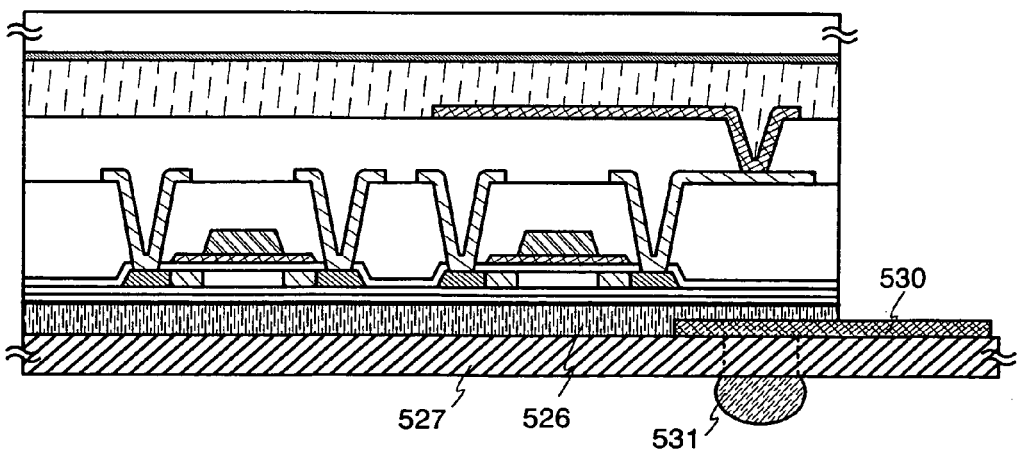

An interposer 527 is bonded to the oxide film 502 on a part of which the metal oxide film 503 is pasted with an adhesive 526 (FIG. 6C). At this time, as a material for the adhesive 526 for bonding the oxide film 502 and the interposer 527, it is important to select the material that has stronger adhesiveness than that of the two-side tape 522 used for bonding the second substrate 523 and the protective layer 521.

If the metal oxide film 503 is remained over the surface of the oxide film 502, the adhesiveness of the interposer 527 may get worse, so that the remained metal oxide film can be completely removed prior to bonding the interposer to the oxide film 502.

As a material for the interposer 527, a known material such as a ceramic substrate, a glass epoxy substrate, a polyimide substrate, or the like, can be used. The material is preferably having high thermal conductivity of approximately from 2 to 30 W/mK for diffusing heat generated in a chip.

A terminal 530 for packaging is provided over the interposer 527 to connect electrically to a solder ball 531 that is provided with the interposer 527. The solder ball 531 is provided over the opposite surface on which the terminal 530 is provided. Only one solder ball is illustrated here, however, a plurality of solder balls is provided over one interposer 527 actually. The pitch between each ball is generally standardized as 0.8 mm, 0.65 mm, 0.5 mm, or 0.4 mm, however the present invention is not limited thereto. The size of each ball is generally standardized as approximately 60% of pitch, however the present invention is not limited thereto.

The terminal 530 is formed of copper coated with solder, gold, or tin. In this embodiment mode, Ball Grid Array having solder balls is used as an interposer, but the present invention is not limited thereto. A leadframe interposer with terminals arranged circumferentially may be used.

As the adhesive 526, various curing adhesives such as a photo-curing adhesive, for example, a reaction-curing adhesive, a thermal-curing adhesive, or a UV-curing adhesive, or an anaerobic adhesive can be used. More preferably, the adhesive 526 is given high thermal conductivity by means of mixing powder comprising silver, nickel, aluminum, or aluminum nitride, or filler.

Figure 7A:
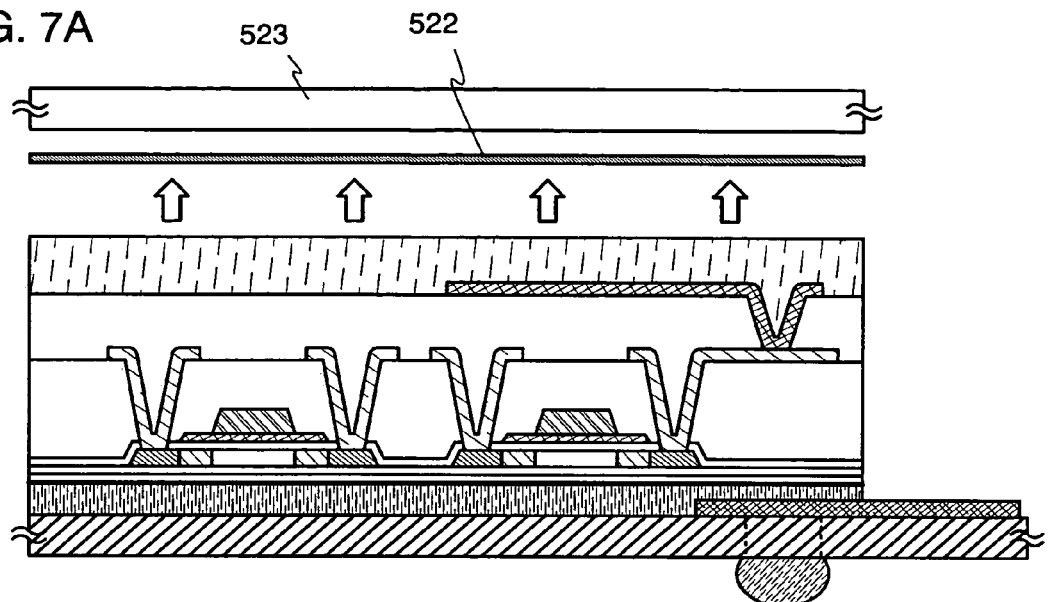
FIGS. 7A to 7C are views for showing a method for manufacturing a package.

As shown in FIG. 7A, the two-sided tape 522 and the second substrate 523 are separated sequentially or simultaneously from the protective layer 521.

Figure 7B:
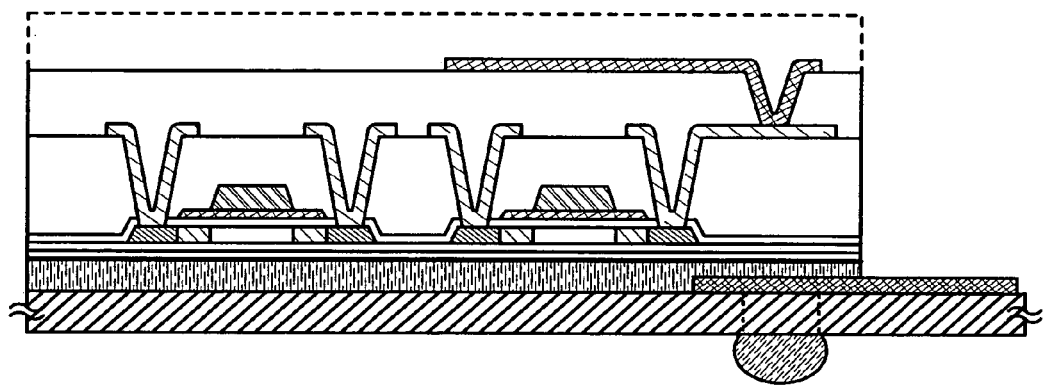
Figure 7C:
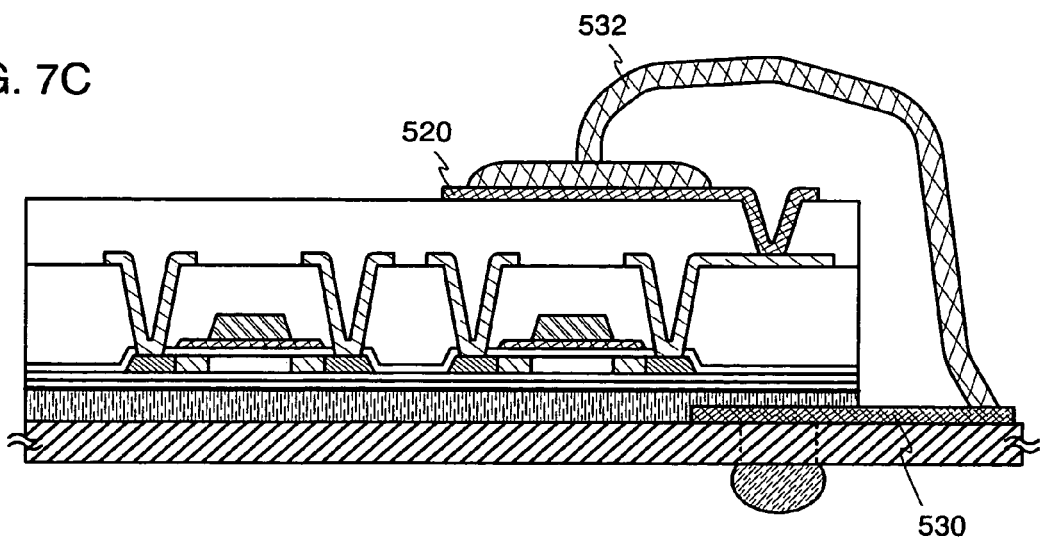

As shown in FIG. 7B, the protective film 521 is removed by water since the protective film 521 is formed of the resin that is soluble in water. In case that the remained protective film 521 causes deterioration, the remained protective film 521 is preferably removed by carrying out cleaning treatment or $O_2$ plasma treatment on the surface.

The pad 520 and the terminal 530 are connected each other by a wire 532 in a connection form of wire bonding to seal in a hermetic sealing manner, plastic molding manner, or the like, and so packaging is completed. In case of using the hermetic sealing manner, a case formed of ceramic, metal, glass, or the like is generally used for the sealing. In case of using the plastic molding manner, a mold resin or the like is specifically used. Although it is not always necessary to seal the chip, the sealing offers some advantages in enhancing mechanical strength of the package, radiating heat generated in the chip, and shielding electromagnetic noises from adjacent circuits.

In this embodiment mode, tungsten is used for a material of the metal film 501, however, the present invention is not limited thereto. Any material can be used as long as which includes metals that allows a substrate to be separated by forming over the surface of the material and crystallizing the metal oxide film 503, for example, W, TiN, WN, Mo, or the like. In case of using these alloys as the metal film, the optimal temperature for heat treatment for crystallization is different depending on the composition ratio of the metal film. On the basis of the fact, the heat treatment can be carried out at the temperature that has no adverse effects on the manufacturing process for a semiconductor device, and selection ranges become difficult to be restricted by adjusting the composition ratio of the metal film.

In this embodiment mode, CSP in which one chip is mounted on one package is explained as an example, however, the present invention is not limited to this. MCP in which a plurality of chips are mounted in parallel with each other or mounted by stacking them up may be adopted.

The first and the second laser light are not limited to the conditions for irradiation described in this embodiment mode.

For example, YAG laser, that is, output powers of 4 W, one pulse energy of 2 mJ/p, $TEM_{00}$ mode, a second harmonic of 532 nm, pulse frequency of 1 kHz, and pulse widths of 30 ns can be used for producing the first laser light. Further, $YVO_4$ laser, that is, output powers of 5 W, one pulse energy of 0.25 mJ/p, $TEM_{00}$ mode, a third harmonic of 355 nm, oscillation frequency of 20 kHz, and pulse widths of 30 ns is used for producing the first laser light. In addition, $YVO_4$ laser, that is, output powers of 3.5 W, one pulse energy of 0.233 mJ/p, $TEM_{00}$ mode, a fourth harmonic of 266 nm, oscillation frequency of 15 kHz, and pulse widths of 30 ns is used as the first laser light.

Nd: YAG laser, that is, output powers of 500 W, and the fundamental wavelength of 1.064 μm, can be used for producing a second laser light. Further, for example, Nd: YAG laser, that is, output powers of 2000 W, and the fundamental wavelength of 1.064 μm, can be used for producing a second laser light.

If the width of beam spot that is perpendicular to the scanning direction can be reserved enough to form a chip, the first laser light can be a continuous oscillation. In case that the first laser light is a continuous oscillation instead of a pulsed oscillation, each chip is formed so as to fit within the widths of the beam spot perpendicular to the scanning direction of the first laser light. In order to reserve the width of beam spot perpendicular to the scanning direction enough to form a chip, a plurality of beam spots of a plurality of first laser lights can be overlapped with each other to form into as one beam spot.

A crystallizing process may be carried out prior to the crystallization using a laser light. As a catalytic element, nickel (Ni) is used here, but germanium (Ge), iron (Fe), palladium (Pa), tin (Sn), lead (Pb), cobalt (Co), platinum (Pt), copper (Cu), gold (Au), or the like, can also be used. If a crystallization process using a laser light is carried out after a crystallization process using a catalytic element, crystals formed by the crystallization process using a catalytic element is not melted and remained at the side nearby a substrate, and so the semiconductor film is crystallized around crystal nucleus formed of the remained crystals. According to this, the semiconductor film is crystallized uniformly in the direction from the substrate to the surface of the semiconductor film, so that the crystallization of the semiconductor film can be enhanced and the rough surface of the semiconductor film can be prevented after crystallizing with a laser light. Thus, the variations of characteristics of the semiconductor device, which will be formed in the subsequent process, typically, TFTs, can be prevented and OFF current can be reduced.

In addition, the crystallization may be enhanced by laser light irradiation after adding catalytic elements and promoting the crystallinity by heat treatment. Or the heat treatment can be omitted. Specifically, the crystallization may be enhanced by laser light irradiation instead of heat treatment after adding catalytic elements.

The thickness of a chip refers to not only the thickness of the semiconductor device itself, but also the thicknesses of an insulating film formed between the metal oxide film and the semiconductor device, an interlayer insulating film for covering the semiconductor film, and pad. The thickness of bump is not referred.

Embodiment Mode 2

The structure of the laser irradiation device used for manufacturing a package according to the present invention will be described with reference to FIG. 4A and FIG. 4B.

Reference numeral 201 denotes a pulsed laser oscillator, Nd: YLF laser achieving power of 6 W is used in the present invention. The laser oscillator 201 is converted into a second harmonic at an oscillation mode of $TEM_{00}$ by a nonlinear optical device. The second harmonic is, not exclusively but preferably, used in this embodiment mode since the second harmonic is favorable in energy efficiency compared with higher harmonics. Its pulse frequency is 1 kHz, and pulse width is approximately 60 ns. A solid state laser achieving approximately output powers of 6 W is used in this embodiment mode, but a large laser that is capable of output powers of 300 W, for example, an XeCl excimer layer, or the like can also be used.

As a linear optical device, crystals such as KTP ($KTiOPO_4$), BBO ($\beta\text{-}BaB_2O_4$), LBO ($LiB_3O_5$), CLBO ($CsLiB_6O_{10}$), GdYCOB ($YCa_4O(BO_3)_3$), KDP ($KD_2PO_4$), KB5, $LiNbO_3$, $Ba_2NaNb_5O_{15}$, and the like, can be used. The conversion efficiency from fundamental wave to harmonics can be increased by using LBO, BBO, KDP, KTP, KB5, CLBO, or the like.

A first laser light produced from the laser oscillator 201 is converted its traveling direction so as the angle of incidence to be $\theta_1$ by a reflection mirror 202 because a laser light is generally emitted in a horizontal direction. In this embodiment mode, the angle of $\theta_1$ is 21°. The first laser light converted its traveling direction is emitted to the subject 204 by processing the beam spot thereof with lenses 203. In FIG. 4A and FIG. 4B, an optical system for controlling the shape and the position of the beam spot of the first laser light corresponds to the reflection mirror 202 and lenses 203.

Figure 1A:
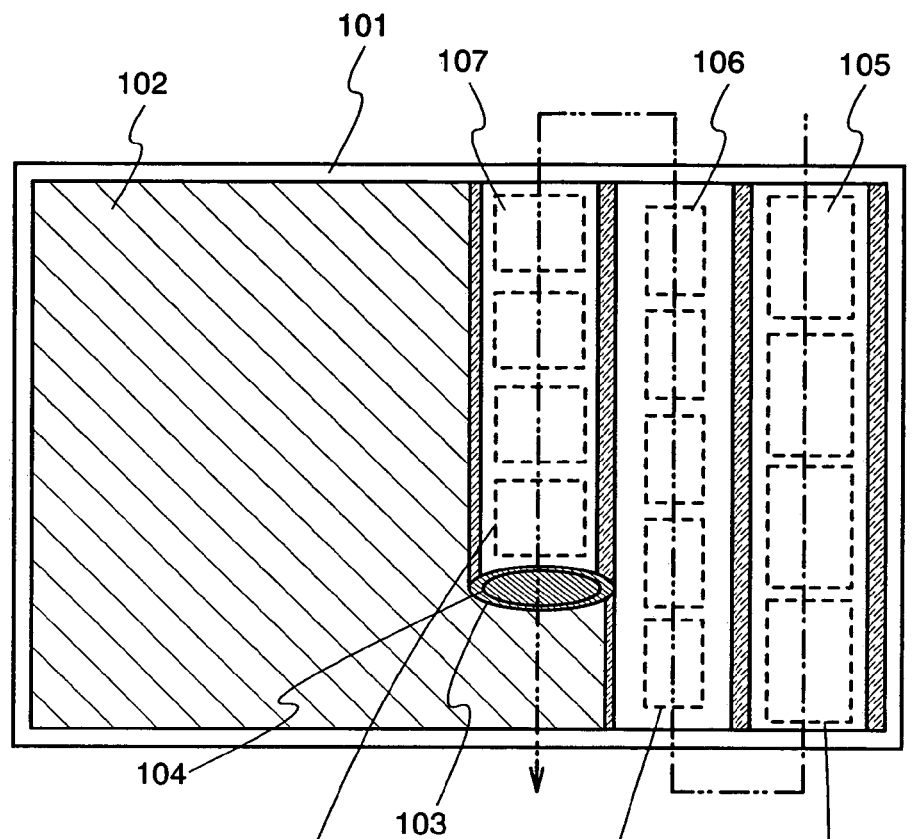
FIG. 1A is a view for showing a scanning pathway of a beam spot during crystallization of a semiconductor film.
Figure 1B:
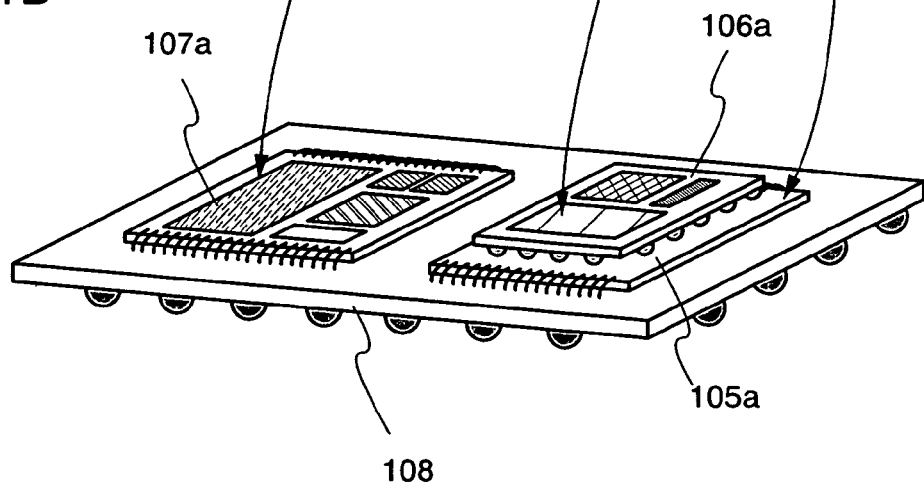
FIG. 1B is an oblique perspective figure of a package on which a chip is mounted.
Figure 2A:
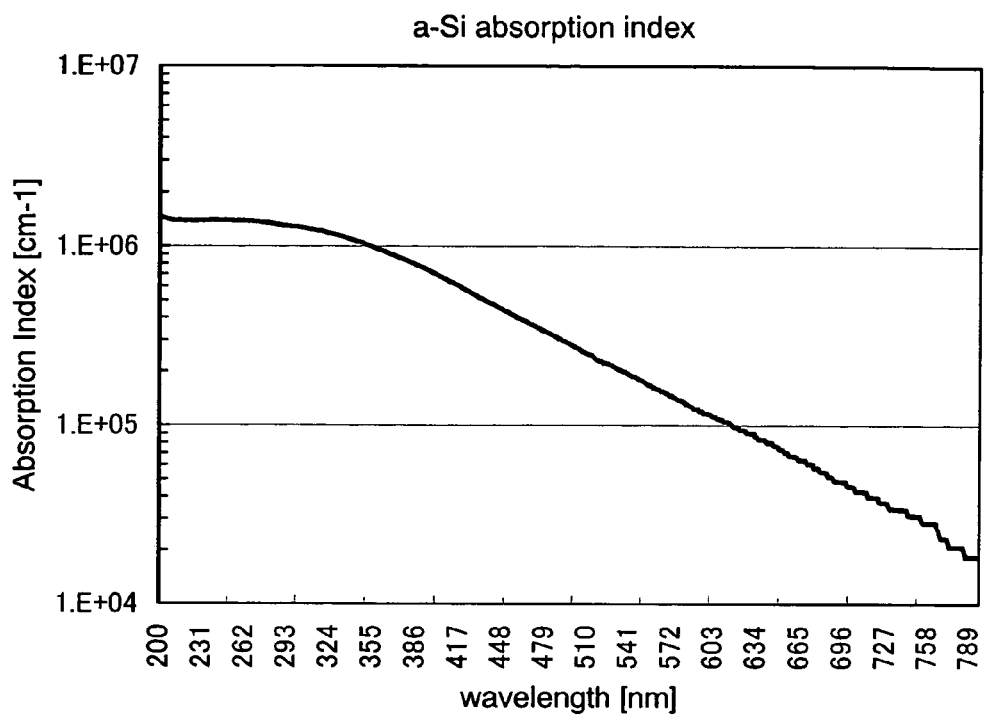
FIG. 2A and FIG. 2B are graphs for showing a relationship between the wavelength and the absorption coefficient of a laser light.
Figure 2B:
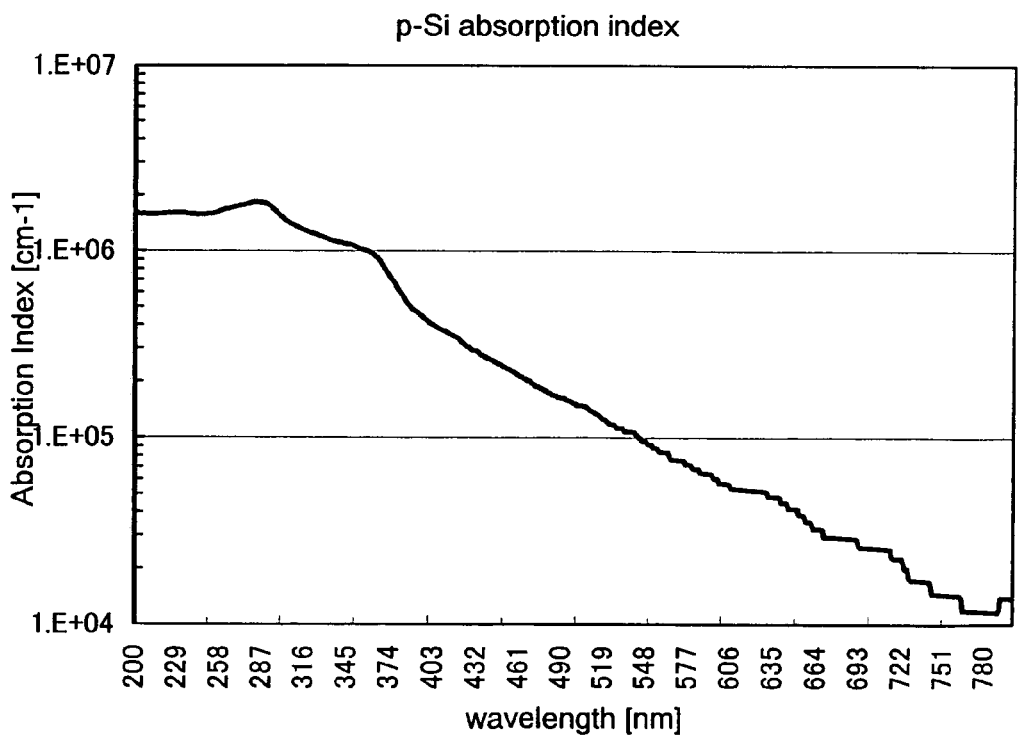
Figure 3A:
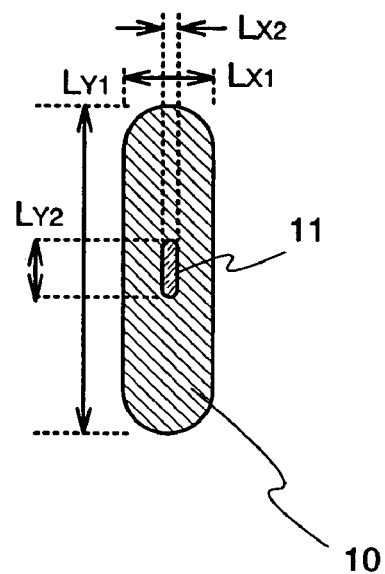
FIGS. 3A and 3B are views for showing a magnitude relation of a beam spot.
Figure 3B:
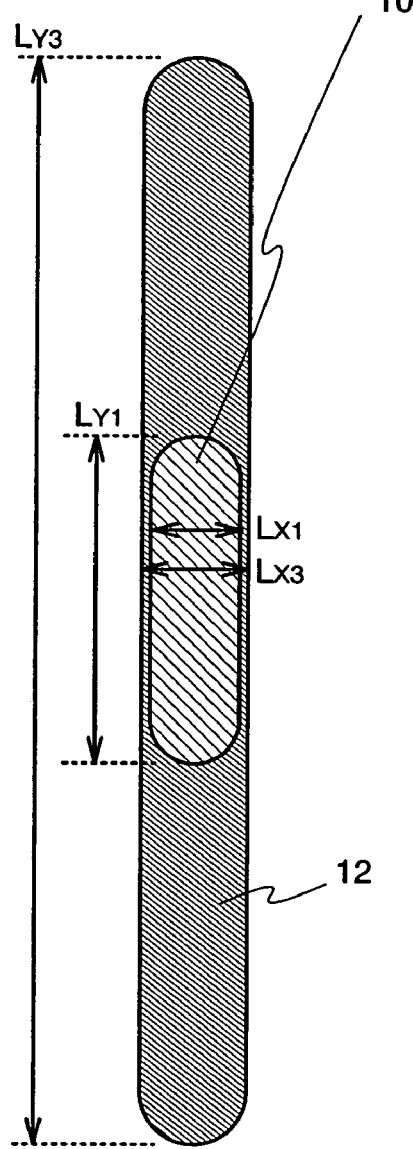
Figure 4:
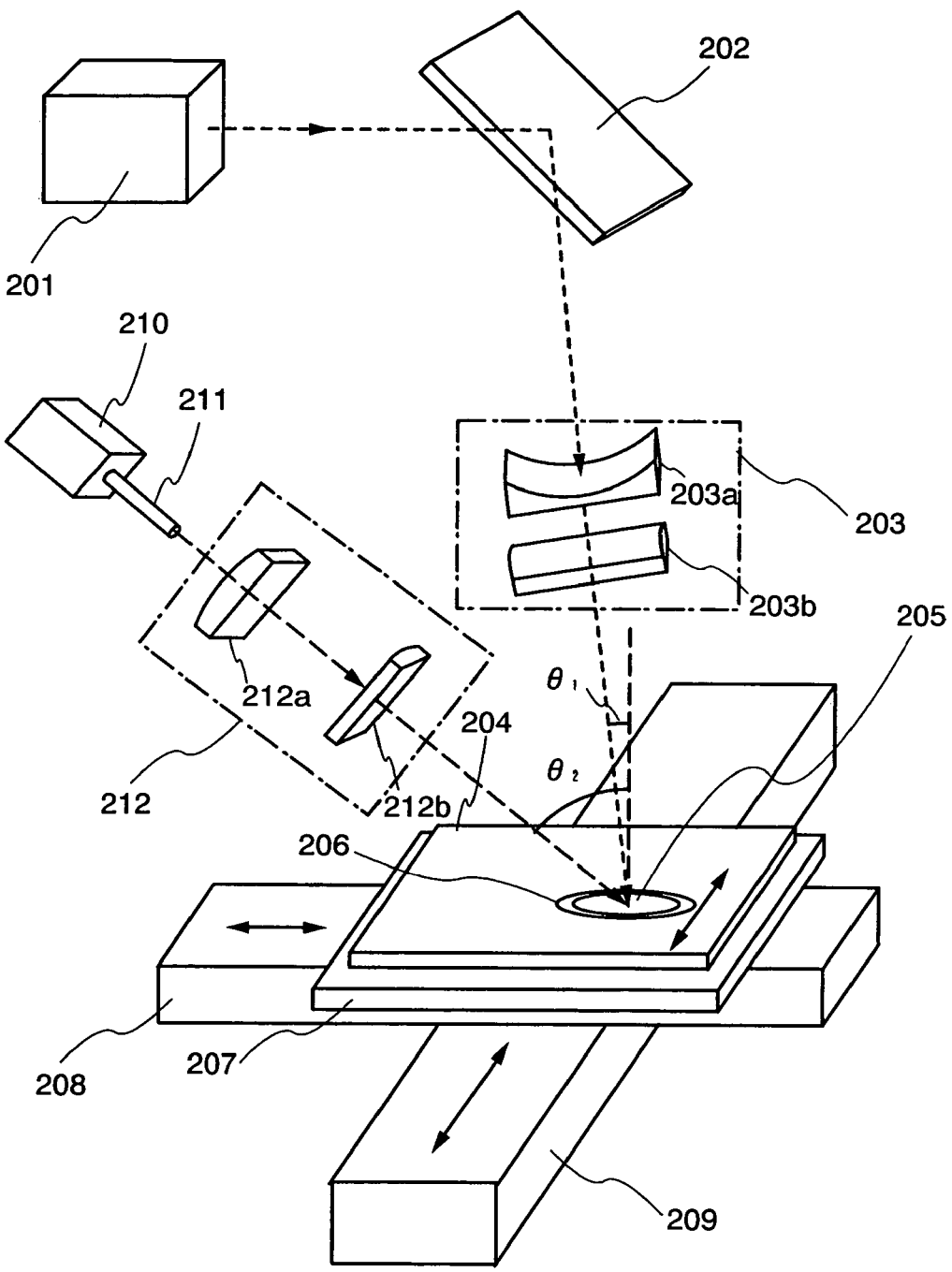
FIG. 4 is view for showing the structure of a laser irradiation apparatus used for crystallization.

As shown in FIG. 4A and FIG. 4B, a plane-concave cylindrical lens 203a and a plane-convex cylindrical lens 203b are used as lenses 203. The plane-concave cylindrical lens 203a has a radius of curvature of 10 mm and a thickness of 2 mm and is arranged in the position of 29 mm from the surface of the subject 204 along with an optical axis in case that the traveling direction is considered as the optical axis. The bus bar of the plane-concave cylindrical lens 203a is perpendicular to the plane of incidence of the first laser light that is entering to the subject 204.

The plane-convex cylindrical lens 203b has a radius of curvature of 15 mm and a thickness of 2 mm and is arranged in the position of 24 mm from the surface of the subject 204 along with an optical axis. The bus bar of the plane-convex cylindrical lens 203b is in parallel to the plane of incidence of the first laser light that is entering to the subject 204.

According to this, a first beam spot 206 of 3 mm×0.2 mm in size is formed on the subject 204.

Reference numeral 210 denotes a CW laser oscillator using Nd: YAG laser achieving output powers of 2 kW. A second laser light produced from the laser oscillator 210 is transmitted in fiber optic 211 of $\phi 300$ μm. The fiber optic 211 is arranged in the position so as the angle of the exit wound ($\theta_2$) to the vertical direction to be 45° in this embodiment mode. The exit wound of the fiber optic 211 is arranged in the position of 105 mm from the subject 204 along with the optical axis of the second laser light that is emitted from the laser oscillator 210. The optical axis is included in the plane of incidence.

The second laser light emitted from the fiber optic 211 is emitted to the surface of the subject 204 by processing the shape of its beam spot by a lens 212. As shown in FIG. 4A and FIG. 4B, the fiber optic 211 and the lens 212 correspond to an optical system for controlling the shape and the position of the beam spot of the second laser light. In FIG. 4A and FIG. 4B, a plane-convex cylindrical lens 212a and a plane-convex cylindrical lens 212b are used as lenses 213.

The plane-convex cylindrical lens 212a has a radius of curvature of 15 mm and a thickness of 4 mm and is arranged in the position of 85 mm from the surface of the subject 204 along with the optical axis of the second laser light. The direction of the bus line of the plane-convex cylindrical lens 212a is perpendicular to the plane of incidence. The plane-convex cylindrical lens 212b has a radius of curvature of 10 mm and a thickness of 2 mm and is arranged in the position of 25 mm from the surface of the subject 204 along with the optical axis of the second laser light.

According to this, a second beam spot 205 of 3 mm×0.1 mm in size is formed on the subject 204.

In this embodiment mode, a substrate on which a semiconductor film is deposited as the subject 204 is provided so as to be in parallel with the horizontal plane. The semiconductor film is, for example, deposited over the surface of a glass substrate. The deposited substrate is a glass substrate having a thickness of 0.7 mm and fixed on the absorption stage 207 in order the substrate not to drop-off during laser irradiation. The absorption stage 207 is possible to move in XY directions within a parallel plane to the subject 204 by a uniaxial robot for X-axis 208 and a uniaxial robot for Y-axis 209.

In case of annealing the deposited semiconductor film over the substrate that is transparent to laser light, in order to realize uniform irradiation of the laser light, it is desirable that an incident angle "φ" of the laser light satisfies the inequality of $\phi \geq \arctan(W/2d)$ in case of defining a plane of incidence as being perpendicular to the irradiated surface and as including either a longer side or a shorter side assuming that a shape of the laser light is rectangular. In the inequality, "W" is a length of the longer side or the shorter side included in the incidence plane and "d" is a thickness of the substrate that is transparent to laser light, which is placed at the irradiated surface. In case of using a plurality of laser lights, the inequality needs to be satisfied with respect to each the plurality of laser lights. It is noted that if a track of the laser light does not exist on the plane of incidence, "φ" is determined as the incident angle of the projected track of the laser light to the plane of incidence. When the laser light is incident at the incident angle of φ, it is possible to irradiate laser light uniformly without reflected light from a surface of the substrate causing interference with reflected light from a rear surface of the substrate. The theory above is considered assuming that a refractive index of the substrate is 1. In fact, a refractive index of substrate is mostly around 1.5 so that a larger calculated value is obtained than the angle calculated in accordance with the inequality considering the value of the refractive index of 1.5. However, since energy attenuation of a beam spot is detected toward the edge of the beam spot, there is a small influence of the interference on the edge and enough effects of interference attenuation can be obtained in accordance with the inequality. It is better that the above discussion and inequality is satisfied with respect to each the first laser light and the second laser light. However, there is no problem if the inequality is not satisfied with respect to an excimer laser that produces lasers having extreme short coherent length. The above inequality of φ is only applied to the case that a substrate is transparent to a laser light.

Generally, a glass substrate is transparent to fundamental waves having wavelength of approximately 1 μm or second harmonics in green. In order the lenses used in this embodiment to satisfy the inequality, the plane-convex cylindrical lens 203b and the plane-convex cylindrical lens 212b is moved in the vertical direction to the surface of the plane of incidence, and incident angles of φ1 and φ2 are made in the plane of incidence that is vertical to the surface of the subject 204 including a minor axis of the beam spot. In this case, if the incident angles φ1 of the first beam spot 206, φ2 of the second beam spot 206 are 10°, 5°, respectively, there is no interference.

The first and the second laser lights are preferably produced from a stable resonator at $TEM_{00}$ mode (single mode). In case of $TEM_{00}$ mode, processing of beam spot become easier since the laser light has Gaussian intensity distribution and provides good light harvesting.

The second beam spot 205 scans the subject 204 (the substrate on which the semiconductor film is deposited) in the minor axis direction by using the Y-axis robot 209. The outputs of each the laser oscillator 201, 202 are specification values. By carrying out the scan of the subject 204, the first beam spot 206 and the second beam spot 205 make relatively a scan of the surface of the subject 204.

The absorption coefficient of the CW second laser light to the semiconductor film is dramatically increased by melting the semiconductor film within the region where the first beam spot 206 is emitted. Thus, single crystal grain grown in scanning direction is formed like paving in the region of 1 to 2 mm corresponding to the longitudinal axis of the second beam spot 205 extending in the scanning direction.

In the semiconductor film, the region to which the first beam spot 206 and the second beam spot 205 is emitted so as to be overlapped each other is kept by the first laser light of fundamental wave in the state that the absorption coefficient is increased by the first laser light of second harmonic. Thus, if the irradiation of the first laser light of second harmonic is stopped, the state that the semiconductor film is melted and the absorption coefficient is increased is kept by the first laser light of fundamental wave. Therefore after stopping the irradiation of the first laser light of second harmonic, the region that is melted and increased its absorption coefficient can be moved a certain distance in one direction by scanning, so that crystal grains grown in the scanning direction are formed. In addition, the first laser light of second harmonic is preferably radiated to supplement energy for keeping continuously the region that is increased its absorption coefficient in the scanning process.

The appropriate scanning speeds of the first beam spot 206 and the second beam spot 205 are from several to several hundreds cm/s, here, the scanning speed is 50 cm/s.

The region irradiated with the second laser light in which crystal grains grown in the scanning direction has better crystallinity. Hence, extreme high electric mobility and on current can be expected by using the region to the channel formation region of a TFT. However, in case that there are some regions that do not need such high crystallinity in the semiconductor film, it is possible not to be irradiated with the laser lights. Or, the laser light may be radiated under the conditions by which high crystallinity is not obtained such as high scanning speed. For example, if the laser light scans at approximately 2 m/s, an amorphous silicon film can be crystallized, however, a region that is crystallized continuously in the scanning direction as described above is hardly formed. In addition, throughput can be further improved by increasing the scanning speed.

An optical system in the laser irradiation system according to the present invention is not limited to the structure described in this embodiment mode.

Embodiment Mode 3

In case of manufacturing simultaneously a plurality of chips over a first substrate, it is necessary that chips are separated from each other by dicing prior to completing a package. The timing of the dicing will be explained in this embodiment mode.

Figure 8:
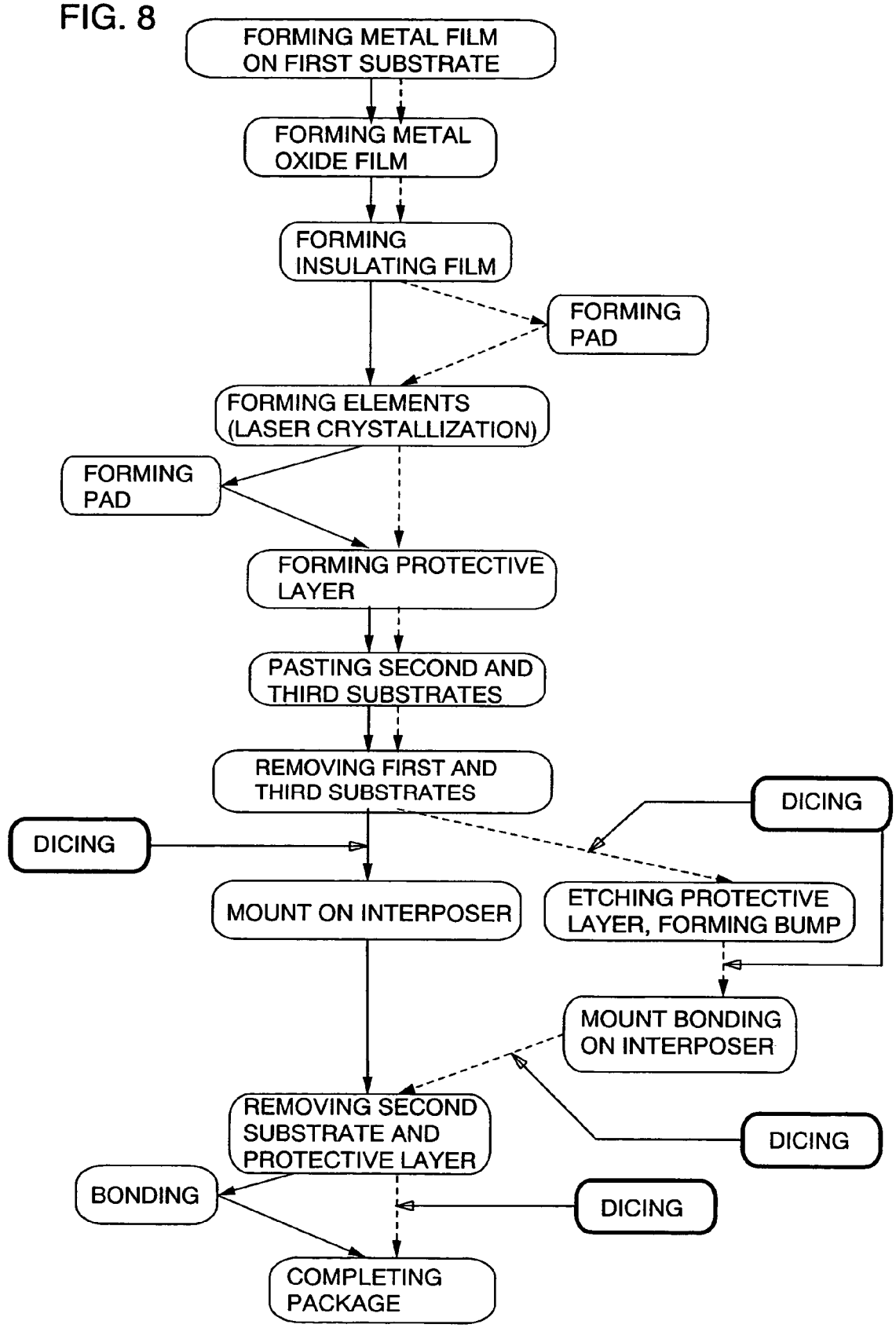
FIG. 8 is a flow chart for showing a process for manufacturing a package.

FIG. 8 shows an example of a flaw chart for showing a manufacturing process of a package. The positions of pads, which serves as a terminal for electric interconnections to an integrated circuit, in wire bonding and in flip chip are different. In FIG. 8, the sequence of a flaw chart by which a pad is formed after forming a device is represented by a full line, and the sequence of a flaw chart by which a pad is formed before forming a device is represented by a dotted line.

The case that a pad is formed after forming a device will be explained hereinafter. First, a metal film is formed over a first substrate, and the surface of the metal film is oxidized, and then, a metal oxide film is formed. Second, an insulating film is formed over the metal oxide film, and a process for forming a device (semiconductor device) is started. In the present invention, laser crystallization of a semiconductor film is carried out within the process for forming a device.

The laser crystallization will not be further explained here since it has already described. A pad is formed after forming a device, and completing an integrated circuit. Subsequently, a protective layer is fabricated so as to cover the device and the pad, and the second substrate is pasted over the side of the protective layer, and then, the third substrate is pasted over the side of the first substrate. Then, the first and the third substrates are separated (peeled) from the device. And then, the device pasted over the second substrate is mounted on an interposer, and the second substrate and the protective layer are removed, then, the device is bonded and sealed to complete a package.

In this case, since the pad is at the opposite side of the interposer via the device, wire bonding can be adopted as the way of bonding the interposer and the chip. In case of adopting the wire bonding, the interposer and the chip are bonded after mounting the chip and removing the second substrate. In this case, the chips are preferably diced after separating the first and the third substrate and before mounting the chip as shown in FIG. 9A.

The case that a pad is formed prior to forming a device will be explained hereinafter. First, a metal film is fabricated over a first substrate, and the surface of the metal film is oxidized, and then, a metal oxide film is fabricated. Second, an insulating film is fabricated over the metal oxide film, and a pad is formed. Then, the process for forming a device (semiconductor device) is started. The device and the pad may be electrically connected each other by fabricating another insulating film therebetween and by forming contact holes. Or the device and the pad may be electrically connected each other without contact holes by forming themselves over one insulating film. A protective layer is formed so as to cover the device after forming a device and completing an integrated circuit. A second substrate is pasted over the side of the protective layer and a third substrate is pasted over the side of the first substrate. Then, the first and the third substrates are separated (peeled) from the device. Flip chip can be adopted as a way of bonding an interposer and the chip since the pad is formed between the device and the interposer. Thus, a bump is formed over the pad after exposing the pad by etching partly the insulating film. A marker used for alignment is preferably formed by using a semiconductor film during forming a device. Then, the device pasted over the second substrate is mounted on an interposer, and bonded by the bump, then, the second substrate and the protective layer is removed, and then, the device is sealed to be completed as a package.

In this case, the chips are preferably diced after separating the first and the third substrates and before mounting as shown in FIG. 9A. Further, the case shown in FIG. 9A, the chips may be diced either before or after forming the bump. The dicing may be carried out before separating the second substrate after mounting as shown in FIG. 9B, or after separating the second substrate as shown in FIG. 9C.

The above explanation is based, but not exclusively, on the premise of mounting only one chip on one interposer. In case of stacking chips each other formed over one first substrate, the chips are preferably diced before mounting as shown in FIG. 9A. Each chip is mounted sequentially after separating the second substrate from the chip beneath the second substrate.

In case of stacking chips each other formed separately over different first substrates, chips that will mount firstly on an interposer can be diced at the timing shown in FIG. 9B or 9C, in addition to the timing shown in FIG. 9A. Also in this case, each chip is mounted sequentially after separating the second substrate from the chip beneath the second substrate.

A process for forming a pad and a process for forming a semiconductor device cannot be always divided clearly. For example, in case of using a top gate TFT as a semiconductor device and forming a pad by the same process of the gate electrode of the TFT, the process for forming a pad is included in the process for forming a semiconductor device. In such a case, the appropriate timing for dicing is decided by the fact that whether the pad (or the bump) is exposed in the direction of the side of the interposer or in the opposite direction of the side of the interposer during mounting the chip on the interposer. Therefore, in case of the former, the chips can be diced at the same timing as that in the case of forming a pad before forming a device. In the case of the latter, the chips can be diced at the same timing as that in the case of forming a pad after forming a device.

Embodiment Mode 4

The way of electric interconnection of an interposer and a chip will be described in this embodiment mode.

Figure 10A:
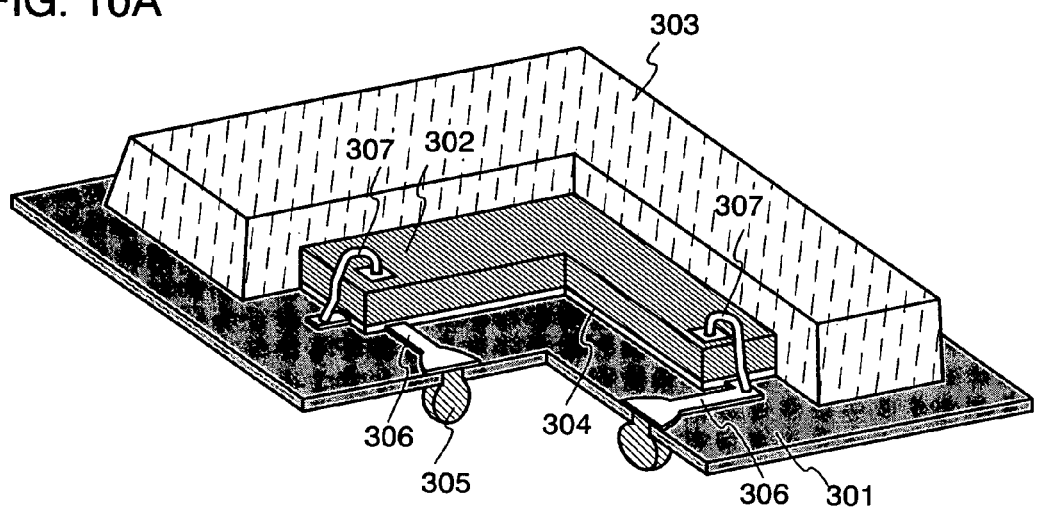
FIG. 10A is an oblique perspective figure for showing the cross-sectional structure of a package.

FIG. 10A is an oblique perspective figure of the cross-sectional view of a package in which a chip is connected to an interposer by wire bonding. Reference numeral 301 denotes an interposer; 302, a chip; and 303, a mold resin layer. The chip 302 is mounted on the interposer 301 by an adhesive 304 that is used for mounting.

The interposer 301 shown in FIG. 10A is ball grid array type provided with a solder ball 305. The solder ball 305 is attached to the interposer 301 at the opposite side to the chip 302. A wiring 306 provided with the interposer 301 is connected electrically to the solder ball 305 via a contact hole provided with the interposer 301.

In this embodiment mode, the wiring 306 for connecting electrically the chip 302 to the solder ball 305 is provided over the surface on which the chip of the interposer is mounted, however, the interposer used in the present invention is not limited thereto. For example, the wiring can be formed to have a multi-layer structure within the interposer.

Figure 10B:
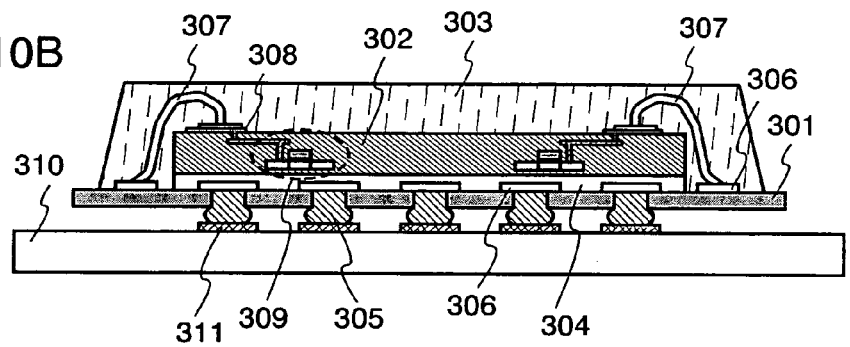
FIGS. 10B to 10D are cross-sectional view of a package.

As shown in FIG. 10A, the chip 302 and the wiring 306 are electrically connected to a wire 307. FIG. 10B is a cross-sectional view of the package shown in FIG. 10A. The chip 302 is provided with a semiconductor device 309. And a pad 308 is attached to the chip at the opposite side to the interposer 308. The pad 308 is electrically connected to the semiconductor device 309 by the wiring provided with the interposer 301 and the wire 307.

Reference numeral 310 denotes a part of a printed wiring board and 311 denotes a wiring or an electrode provided with the printed wiring board. The wiring 306 is connected to the wiring or electrode 311 provided with the printed wiring board 310 via the solder ball 305. The way of connecting the solder ball 305 and the wiring or electrode 311 can use various methods such as thermocompression or thermocompression added with ultrasonic vibration. An under filling may be used to fill gaps between solder balls after the thermocompression, or enhance the mechanical strength of connecting portion and the coefficient of thermal diffusivity of heat generated in the package. The under filling, though which is not always necessary to be used, can prevent poor electrical connection due to stress caused by the mismatch coefficient of thermal expansion of the interposer and the chip. In case of bonding by thermocompression added with ultrasonic vibration, poor electrical connection can be prevented compared with the case of bonding solely by thermocompression. Especially, it has a beneficial effect on the case that the bumps for connecting are more than approximately 300.

Figure 10C:
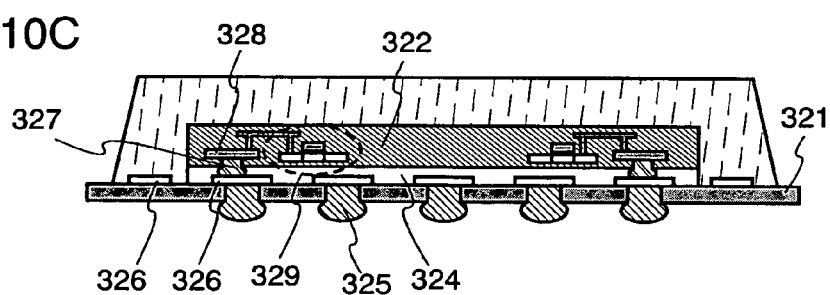

FIG. 10C is a cross-sectional view of a package in which a chip is connected to an interposer by flip chip. In a package shown in FIG. 10C, a chip 322 is provided with a solder ball 327. The solder ball 327 is provided to the chip 322 at the side of an interposer 321 and is connected to a pad 328 provided to the chip 322. A semiconductor device 329 provided with the chip 322 is connected to the pad 328. In case of using a TFT as the semiconductor device 329, the pad 328 may be formed of a conductive film that is used for forming the gate electrode of the TFT.

The solder ball 327 is connected to a wiring 326 provided to the interposer 321. In FIG. 10C, an under filling 324 is formed to fill gaps between the solder balls 327. The solder ball 325 is provided to the interposer 321 at the opposite side of the chip 322 that is mounted over the interposer 321. The wiring 326 is provided to the interposer 321 is electrically connected to the solder ball 325 via a contact hole provided to the interposer 325.

Flip chip is more suitable for connecting chips that have a great number of terminals compared with wire bonding even if the number of pad that should be connected is increased since the pitch between pads can be comparatively kept widely.

Figure 10D:
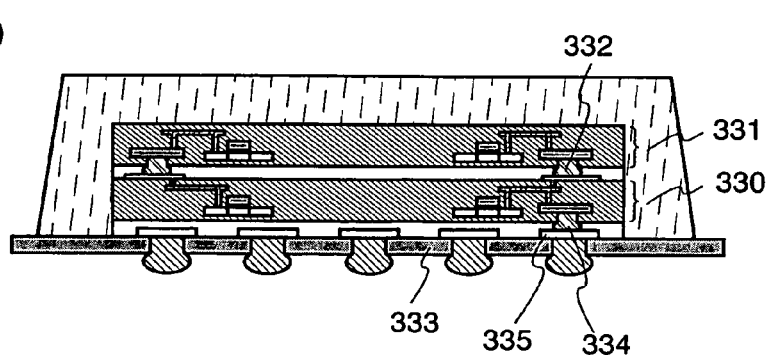

FIG. 10D is a cross-sectional view of a package in which chips are stacked by flip chip. In the package shown in FIG. 10D, two chips 330, 331 are stacked over the interposer 333. A wiring 335 provided to the interposer 333 is electrically connected to the chip 330 by a solder ball 334. The chip 330 and the chip 331 are electrically connected each other by a solder ball 332.

Figure 11:
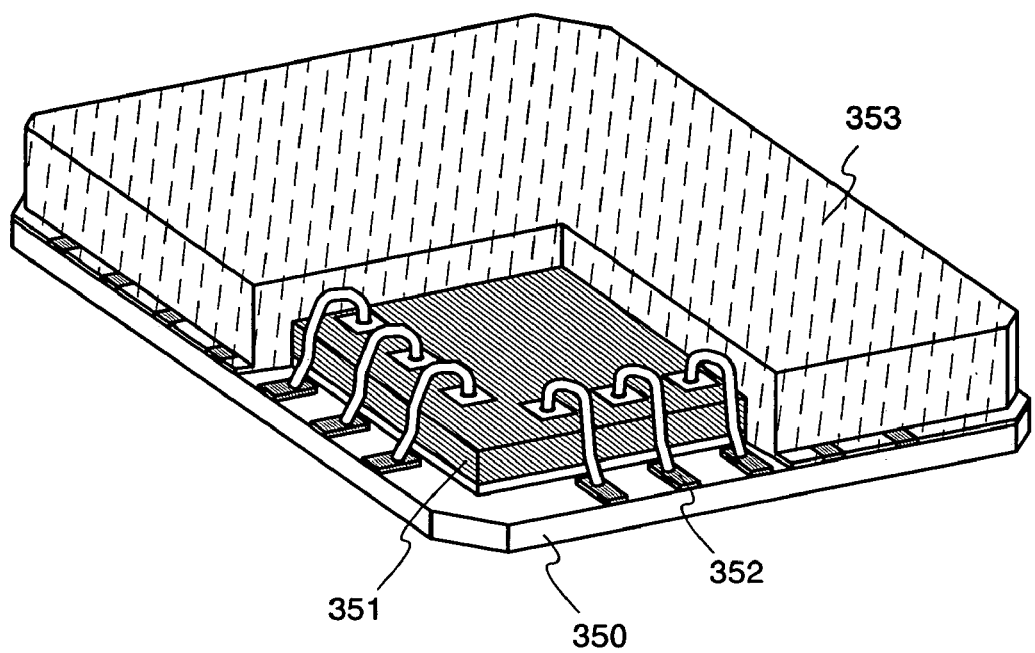
FIG. 11 is an oblique perspective figure for showing the cross-sectional structure of a package.

Packages shown in FIGS. 10A to 10D use ball grid array interposers, however the present invention is not limited thereto. Leadframe interposer in which terminals are arranged at the edge portion may be used. FIG. 11 is an oblique perspective figure of the cross-sectional view of a package using a leadframe interposer.

In a package shown in FIG. 11, a chip 351 is connected to a terminal 352 over an interposer 350 by wire bonding. The terminal 352 is provided over the interposer 350 on which the chip 351 is mounted. The chip 351 may be sealed by a mold resin 353 to expose a part of each terminal 352.

Figure 12A:
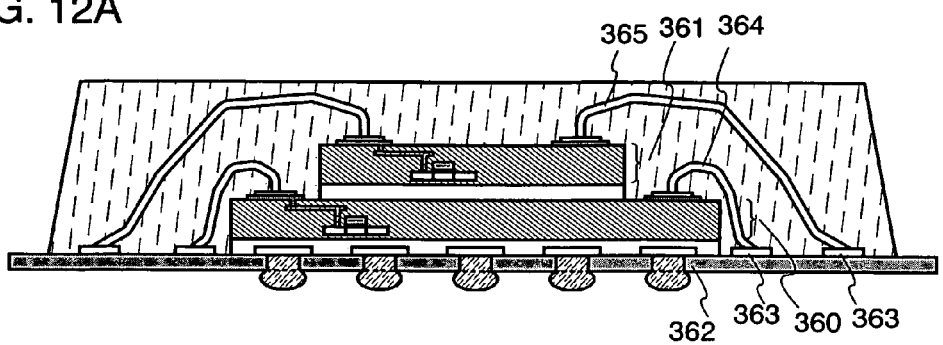
FIGS. 12A and 12B are cross-sectional views for showing the structure of a package.

FIG. 12A is a cross-sectional view of a package in which stacked chips are connected each other by wire bonding. As shown in FIG. 12A, two chips 360, 361 are stacked over an interposer 362. The chip 360 is electrically connected to the chip 361 by a wiring 363 provided to the interposer 362 and a wire 364. The chip 361 is electrically connected to the chip 360 by a wiring 363 provided to the interposer 362 and a wire 365.

In FIG. 12A, although the chip 360 and the chip 361 are connected each other via wirings and wires provided to the interposer 362, chips are connected each other by wires.

Figure 12B:
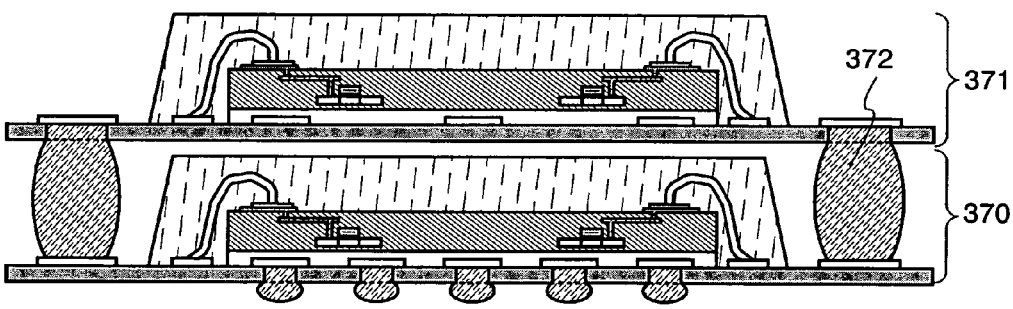

FIG. 12B shows an example of stacking packages. As shown in FIG. 12B, packages 370, 371 in which chips are mounted are electrically connected each other by a solder ball 372 and stacked.

Compared the case that chips are stacked and mounted over one interposer with the case that packages are stacked each other, the former has an advantage of reducing the overall package size. On the other hand, the latter has an advantage of improving its yield since it is possible that the package is inspected electrically to select nondefectives to be stacked.

In the package according to the present invention, chips can be bonded by combining wire bonding and flip chip. In addition, the chips can be bonded by arranging stacked chips and a single chip in parallel instead of stacking chips.

Embodiment Mode 5

An example of the way of stacking chips will be explained in specific in this embodiment mode. According to a manufacturing method described in Embodiment Mode 1, chips are stacked up to stacking the first-layered chip as shown in FIG. 7B.

Figure 13A:
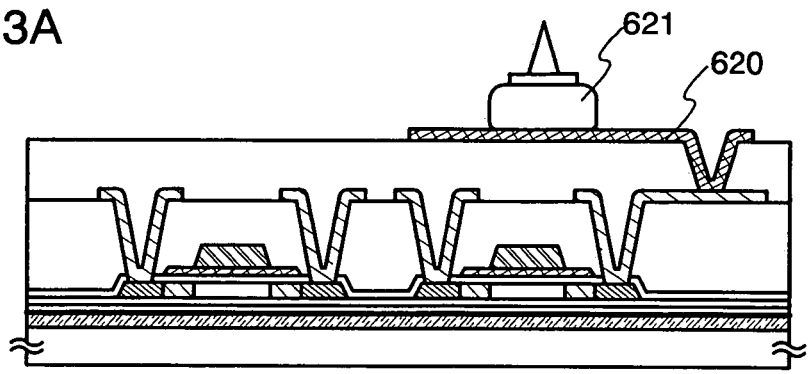
FIGS. 13A and 13B are views for showing a method for manufacturing a built-up package.

The second-layered chip is manufactured according to the manufacturing method described in Embodiment Mode 1 up to the state shown in FIG. 5D. Then, as shown in FIG. 13A, a bump 621 is formed over a pad 620. In this embodiment mode, a bump with a projection is used instead of a spherical bump since an example of connecting chips by thermocompression added with ultrasonic vibration will be described.

Figure 13B:
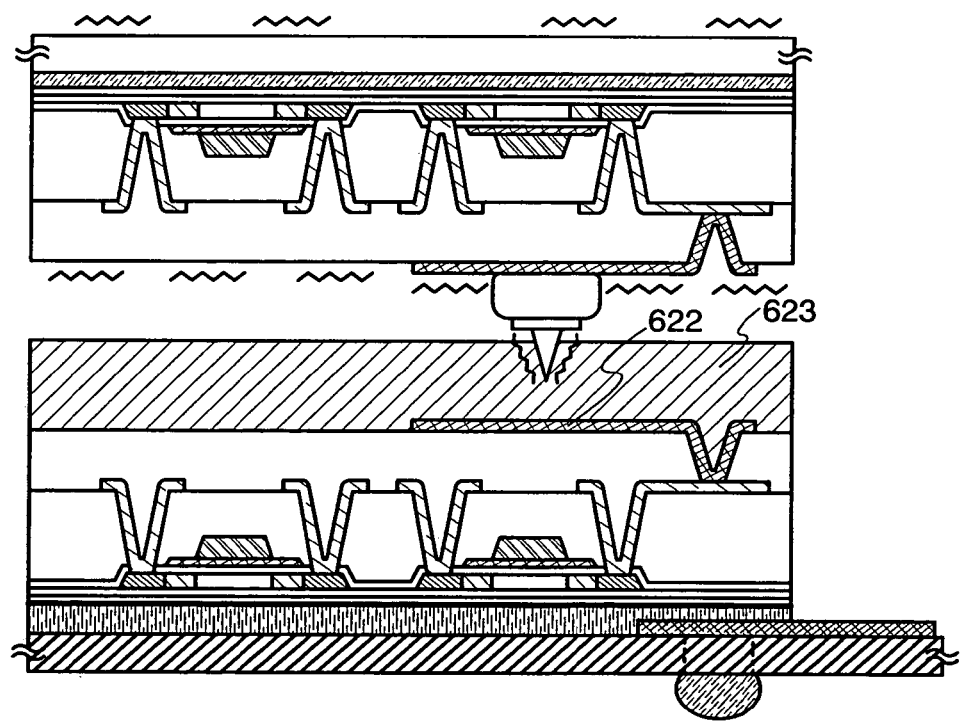

As shown in FIG. 13B, an under filling 623 is coated to cover a pad 622 of the first-layered chip. Then, the second-layered chip shown in FIG. 13A is bonded with pressure to the pad 622 of the first-layered chip so as the bump 621 to face with the pad 622. In this embodiment mode, the bump 621 is bonded with pressure to the pad 622 by transmitting ultrasonic vibrations to the second-layered chip. The projection of the pad 622 is reached to the pad 622 by digging into the under filling 623, and is pressed to be flattened, and then, bonded to the pad 622.

The adhesiveness between chips is enhanced by curing the under filling, specifically, by heat-treating or irradiating UV light. Next, as shown in Embodiment Mode 1, a metal oxide film 624 is crystallized. By the crystallization, the metal oxide film 624 is susceptible to be cracked at the grain boundary so that the brittleness can be enhanced. In this embodiment mode, the metal oxide film 624 is crystallized by heat-treating at from 420 to 550° C. for approximately from 0.5 to 5 hours.

Figure 14A:
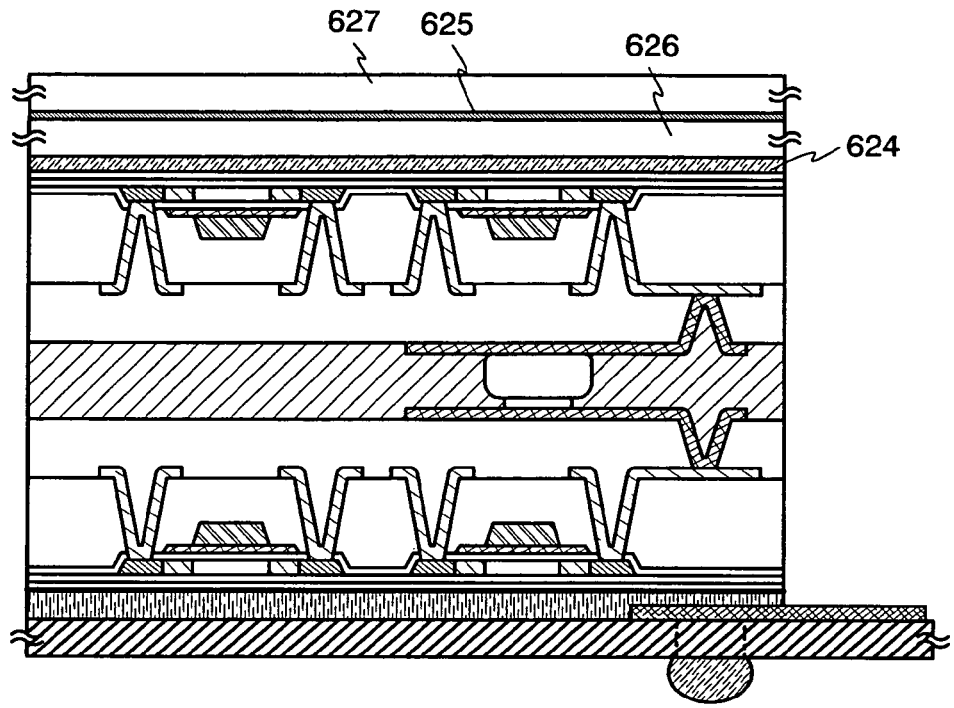
FIGS. 14A and 14B are views for showing a method for manufacturing a built-up package.
Figure 14B:
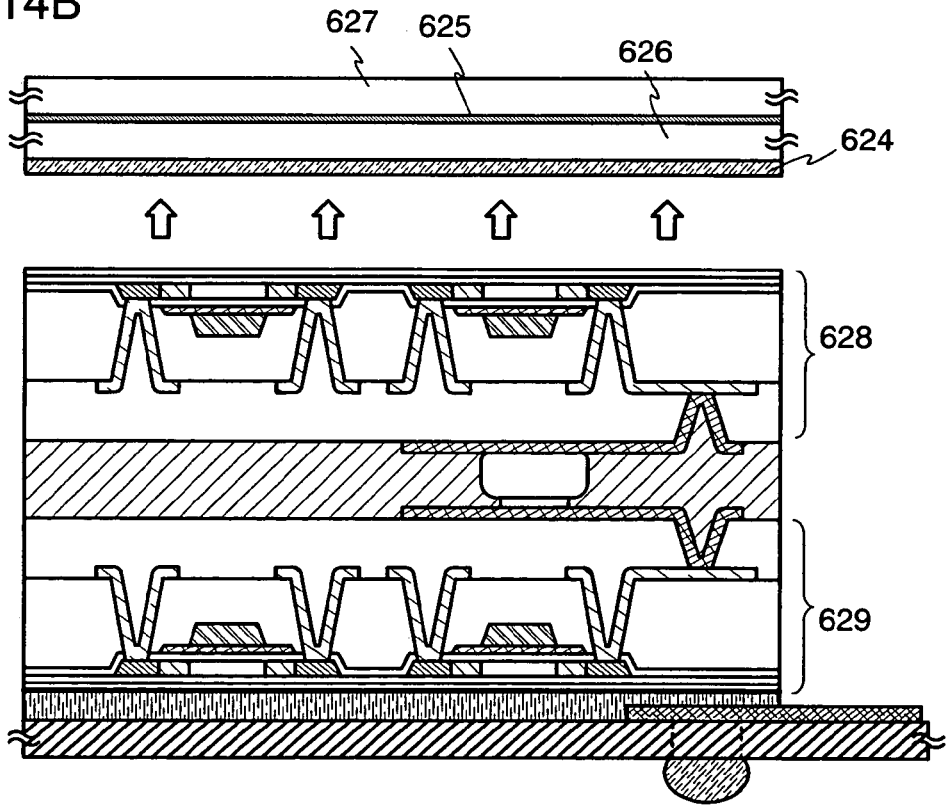

As shown in FIG. 14A, a third substrate 638 is pasted over a first substrate 626 by a two-sided tape 625. Then, as shown in FIG. 14B, the first substrate 626 is separated from the second-layered chip 628 by splitting-off the metal oxide film 624.

According to the above structure, the first-layered chip 629 and the second-layered chip 628 can be stacked so as to connect electrically each other.

Embodiment

Figure 15A:
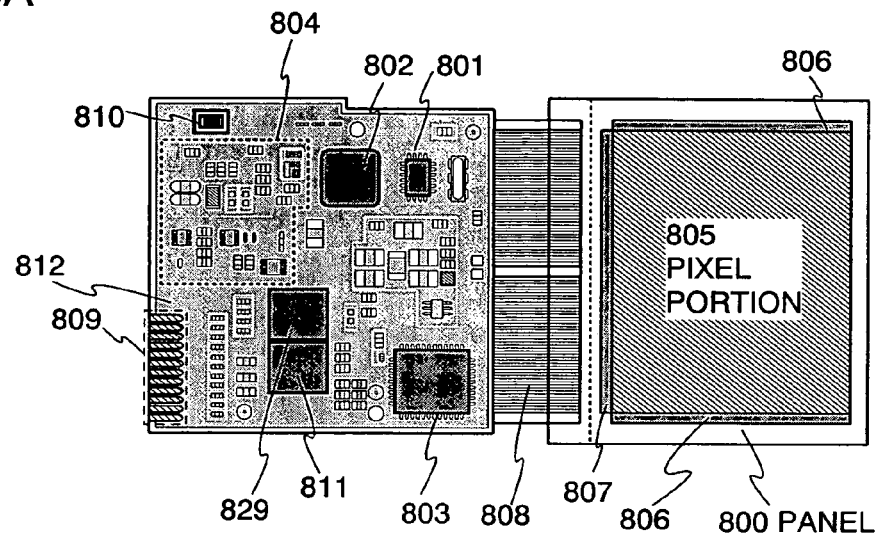
FIGS. 15A and 15B are a top view and a block diagram for showing a module of a cellular phone that is one of electric appliances according to the present invention.

FIG. 15A shows a state that a package is actually installed in an electric appliance taking a cellular phone that is one of electric appliances according to the present invention.

A controller 801, a CPU 802, a memory 811, a power source circuit 803, a speech processing circuit 829, and a transmitter-receiver circuit 804 are mounted on a printed wiring board 812, and devices such as a resistance, a buffer, a capacity, or the like are mounted in the module of a cellular phone shown in FIG. 15A. A panel 800 is mounted on the printed wirings board 812 by FPC. A pixel portion 805, a scanning line driver circuit 806 for selecting pixels for the pixel portion 805, and a signal line driver circuit 807 for supplying a video signal to the selected pixels are mounted on a panel 800.

Various signals inputted to the printed wiring board 812 from a power source voltage, a keyboard, and the like are supplied via an interface (I/F) portion 809 provided with a plurality of input terminals for the printed wiring board.

Further, a port for antenna 810 for transmitting and receiving signals between the printed wiring board and an antenna is provided to the printed wiring board 812.

In this embodiment, the printed wiring board 812 is installed, but not exclusively, in the panel 800 by a FPC. The controller 801, the speech processing 829, the memory 811, the CPU 802, or the power source circuit 803 can be directly installed in the panel 800 by a COG (Chip On Glass).

In the printed wiring board 812, resistance or the like of a capacity or a wiring formed between lead wirings may cause interference on the power source voltage or the signal, or dullness of rising of signals. Then, various devices such as a capacity device, a buffer, or the like are provided to the printed wiring board 812 to prevent the interference on the power voltage or the signal and dullness of rising of signals.

Figure 15B:
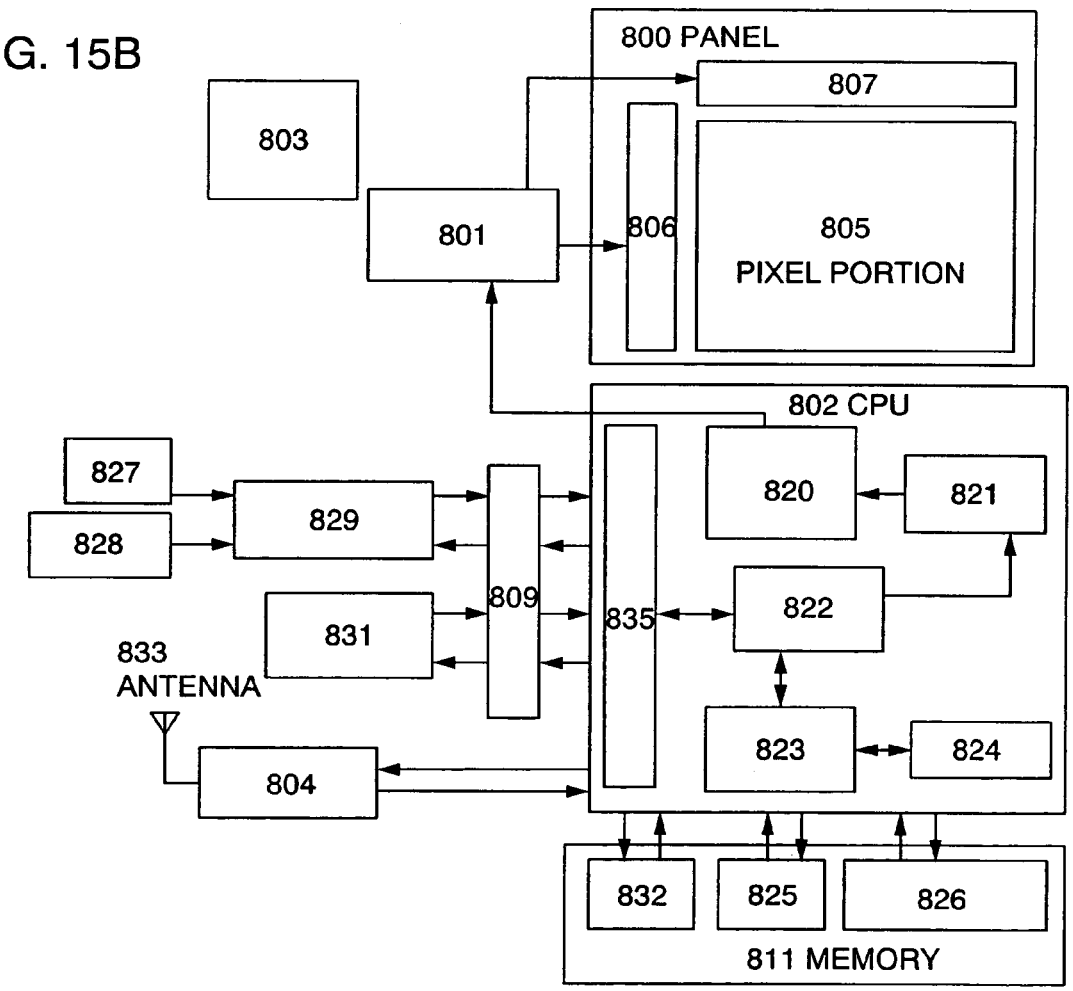

FIG. 15B is a block diagram of a module shown in FIG. 15A.

In this embodiment, a VRAM 832, a DRAM 825, a flash memory 826, and the like are included as the memory 811. An image data for displaying on a panel is stored in the VRAM 832, an image data or a speech data is stored in the DRAM 825, and various programs are stored in the flash memory.

The panel 800, the controller 801, the CPU 802, the speech processing circuit 829, the memory 811, the transmitter-receiver circuit 804, and power source voltage are generated in the power source circuit 803. A current source may be provided with the power source circuit 803 depending on the specification of the panel.

A control signal generation circuit 820, a decoder 821, a resister 822, an operation circuit 823, a RAM 824, an interface for CPU 835, and the like are provided to the CPU 802. Various signals inputted to the CPU 802 via the interface 835 are stored once in a resistor 822, and inputted to the operation circuit 823 and the decoder 821. The operation circuit 823 carries out an operation based on the inputted signals and designates a place for sending various instructions. On the other hand, the inputted signal to the decoder 821 is decoded and inputted to the control signal generation circuit 820. The control signal generation circuit 820 produces signals including various instructions based on the inputted signals and sends the signals to a designated place by the operation circuit 823, specifically, the memory 811, the transmitter-receiver circuit 804, the speech processing circuit 829, and the controller 801.

The memory 811, the transmitter-receiver circuit 804, the speech processing circuit 829, and the controller 801 operates according to instructions received respectively. Hereinafter, each the operation will be described.

The signal inputted from a keyboard 831 is transmitted into the CPU 802 mounted on the printed wiring board 812 via the interface 809. In the control signal generation circuit 820, an image data stored in the VRAM 832 is converted into a prescribed format in accordance with the signal transmitted from a keyboard 831 and send to the controller 801.

The image data send from the CPU 802 is data-processed in accordance with the panel in the controller 801, and supplied to the panel. In addition, the controller 801 generates a Hsync signal, a Vsync signal, a clock signal CLK, and a volts alternating current (AC Cont) based on as power supply voltage inputted from the power source voltage 803 or various signals inputted from CPU, and supply these signals to the panel.

In the transmitter-receiver circuit 804, a signal which is transmitted and received to and from antenna 833 as an electric wave is processed, specifically, a high frequency circuit such as an isolator, a band pass filter, a VCO (Voltage Controlled Oscillator), an LPF (Low Pass Filter), a coupler, and a balun are included. A signal among signals transmitted and received to and from the transmitter-receiver circuit 804 is send to the speech processing circuit 829 by an instruction of the CPU 802.

A signal send by the instruction of the CPU 802 is demodulated into a speech signal in the speech processing circuit 829, and send to a speaker 828. A speech signal send from mike is modulated in the speech processing circuit 829, and send to the transmitter-receiver circuit 804 by an instruction of the CPU 802.

The controller 801, the CPU 802, the power source circuit 803, the speech processing circuit 829, and the memory 811 can be installed as the semiconductor chip according to the present invention. The present invention can be applied to any circuit except high frequency circuits such as the isolator, the band pass filter, the VCO (Voltage Controlled Oscillator), an LPF (Low Pass Filter), the coupler, and the balun.

According to the present invention, since a larger and lower cost glass substrate than those of a silicon wafer can be used, chips can be mass-produced at a lower cost with higher throughput, so that a manufacturing cost per one chip can be reduced dramatically. In addition, a substrate can be repeatedly used, and so a cost per one chip can be reduced.

It is possible that a chip can be formed to have an extreme thin film thickness such as 5 μm in total, preferably at most 2 μm without back grind that causes cracks or polishing marks. The variations of a chip thickness is approximately at most several hundreds nm since it depends on the variations during a film formation for composing chips. Hence, the variations of the chip thickness can be dramatically reduced compared to the variations of several to several ten μm due to the back grind.

By using a package according to the present invention for an electric appliance, more chips having a large circuit size and a large amount of memory can be installed in the limited capacity of an electric appliance, so that an electric appliance can be formed to have many functions, to be miniaturized, and to be lightweight. Especially, since miniaturization and weight saving are emphasized in a portable electric appliance, it is effective to use the package according to the present invention therein.

In the present invention, the absorption coefficient of a fundamental wave is enhanced by melting a semiconductor film by being irradiated with a first pulsed laser light, which is susceptible to be absorbed in a semiconductor film, having wavelength that is equal to or shorter than that of a visible light. By producing the first laser light in a pulsed manner, the area for a beam spot can be increased dramatically compared to a CW laser light. Then, the melted semiconductor film is irradiated with a second laser light, and then, the second laser light is effectively absorbed in the semiconductor film of which absorption coefficient is enhanced. According to this, the longitudinal axis of a beam spot can be extended, the throughput of laser crystallization can be improved, and the freedom of a design rule for forming chips can be increased.

By using fundamental waves for the second laser light, it is unnecessary to give consideration to resistance of a nonlinear optical device for converting fundamental waves to harmonics, and so a laser that can achieve extreme large output power, for example 100 times or more output power than that of harmonics, can be used as the second laser light. Thus, complicated maintenance of a nonlinear optical device that is required due to deterioration of deformation of the nonlinear optical device becomes unnecessary. The advantage of a solid laser, that is, capable of keeping for a long time the state of maintenance-free can be utilized.

What is claimed is:

1. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a semiconductor device using the crystallized semiconductor film;
    bonding a second substrate over the semiconductor device;
    removing the first substrate from the semiconductor device;
    bonding an interposer to the semiconductor device; and
    removing the second substrate from the semiconductor device.

2. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a semiconductor device using the crystallized semiconductor film;
    bonding a second substrate over the semiconductor device;
    removing the first substrate from the semiconductor device;
    bonding an interposer to the semiconductor device;
    removing the second substrate from the semiconductor device; and
    electrically connecting the interposer and the semiconductor device.

3. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a semiconductor device using the crystallized semiconductor film;
    bonding a second substrate over the semiconductor device;
    removing the first substrate from the semiconductor device;
    electrically connecting an interposer to the semiconductor device; and
    removing the second substrate from the semiconductor device.

4. A method for manufacturing a semiconductor apparatus comprising the steps of:
    forming a semiconductor film over an obverse side of a first substrate;
    crystallizing the semiconductor film by irradiating the semiconductor film with overlapped beam spots of a first laser light and a second laser light to form a crystallized semiconductor film;
    forming a semiconductor device using the crystallized semiconductor film;
    bonding a second substrate over the semiconductor device;
    bonding a third substrate to a reverse side of the first substrate;
    removing the first substrate and the third substrate from the semiconductor device;
    bonding an interposer to the semiconductor device;
    removing the second substrate from the semiconductor device; and
    electrically connecting the interposer to the semiconductor device.

5. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a plurality of semiconductor devices using the crystallized semiconductor film;
    bonding a second substrate over the plurality of semiconductor devices;
    removing the first substrate from the plurality of semiconductor devices;
    cutting off a semiconductor device from the plurality of semiconductor devices by dicing the second substrate;
    bonding an interposer to the semiconductor device; and
    removing the second substrate from the semiconductor device.

6. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a plurality of semiconductor devices using the crystallized semiconductor film;
    bonding a second substrate over the plurality of semiconductor devices;
    removing the first substrate from the plurality of semiconductor devices;
    bonding an interposer to the plurality of semiconductor devices;
    cutting off a semiconductor device from the plurality of semiconductor devices by dicing the second substrate and the interposer; and
    removing the second substrate from the semiconductor device.

7. A method for manufacturing a semiconductor apparatus comprising the steps of:
    forming a semiconductor film over a first substrate;
    crystallizing the semiconductor film by irradiating the semiconductor film with overlapped beam spots of a first laser light and a second laser light to form a crystallized semiconductor film;
    forming a plurality of semiconductor devices using the crystallized semiconductor film;
    bonding a second substrate over the plurality of semiconductor devices;
    removing the first substrate from the plurality of semiconductor devices;
    bonding an interposer to the plurality of semiconductor devices;
    removing the second substrate from the plurality of semiconductor devices; and
    cutting off a semiconductor device from the plurality of semiconductor devices by dicing the interposer.

8. The method for manufacturing the semiconductor apparatus according to any one of claims 1 to 7, wherein a metal film, a metal oxide film and an insulating film are formed between the first substrate and the semiconductor film.

9. The method for manufacturing the semiconductor apparatus according to any one of claims 1 to 7, wherein the first laser light is a pulsed laser light and the second laser light is a CW laser light.

10. The method for manufacturing the semiconductor apparatus according to any one of claims 1 to 7, wherein the first laser light has a wavelength having an absorbent coefficient of at least $1 \times 10^4$ cm$^{-1}$ for the semiconductor film.

11. The method for manufacturing the semiconductor apparatus according to claim 8, wherein the method further comprises a step of crystallizing the metal oxide film by heat-treating.

12. The method for manufacturing the semiconductor apparatus according to claim 8, wherein the step of the forming the semiconductor device comprises a step of crystallizing the metal oxide film by heat-treating.

13. The method for manufacturing the semiconductor apparatus according to claim 8, wherein the metal oxide film is formed by oxidizing a surface of the metal film.

14. The method for manufacturing the semiconductor apparatus according to any one of claims 1 to 7, wherein the first laser light is a second harmonic laser light.

15. The method for manufacturing the semiconductor apparatus according to any one of claims 1 to 7, wherein the second laser light is a fundamental wave laser light.

16. The method for manufacturing the semiconductor apparatus according to any one of claims 1 to 7, wherein the beam spots of the first laser light and the second laser light are moved relatively to the semiconductor film, and the semiconductor device is formed so as to fit within a width of a beam spot of the second laser light in a vertical direction to a moving direction of the beam spots of the first laser light and the second laser light.

17. The method for manufacturing the semiconductor apparatus according to claim 16, wherein the width of the beam spot of the second laser light is at least 10 mm and at most 50 mm.

* * * * *